United States Patent
Miyata et al.

(10) Patent No.: US 12,401,868 B2
(45) Date of Patent: Aug. 26, 2025

(54) HYPERSPECTRAL IMAGING DEVICE CAPABLE OF ACQUIRING POLARIZATION INFORMATION AND OPTICAL ELEMENT THEREOF

(71) Applicant: Nippon Telegraph and Telephone Corporation, Tokyo (JP)

(72) Inventors: Masashi Miyata, Musashino (JP); Yoko Sogabe, Musashino (JP); Fumihide Kobayashi, Musashino (JP); Shiori Sugimoto, Musashino (JP); Naru Nemoto, Musashino (JP); Toshikazu Hashimoto, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 172 days.

(21) Appl. No.: 18/273,224

(22) PCT Filed: Jan. 27, 2021

(86) PCT No.: PCT/JP2021/002909
§ 371 (c)(1),
(2) Date: Jul. 19, 2023

(87) PCT Pub. No.: WO2022/162800
PCT Pub. Date: Aug. 4, 2022

(65) Prior Publication Data
US 2024/0147032 A1   May 2, 2024

(51) Int. Cl.
*H04N 5/335*   (2011.01)
*H04N 23/12*   (2023.01)
(Continued)

(52) U.S. Cl.
CPC .............. *H04N 23/12* (2023.01); *H04N 23/55* (2023.01); *G02B 1/002* (2013.01)

(58) Field of Classification Search
CPC ............................. H04N 23/12; G06N 3/0464
See application file for complete search history.

(56) References Cited

U.S. PATENT DOCUMENTS

| 7,224,458 B2 * | 5/2007 | McIntyre ............ G03F 7/70591 |
| | | 356/364 |
| 2018/0184052 A1 | 6/2018 | Sato et al. |

(Continued)

FOREIGN PATENT DOCUMENTS

| JP | 2018107794 | 7/2018 |
| JP | 202051868 A | 4/2020 |

(Continued)

OTHER PUBLICATIONS

Arce et al., "Compressive Coded Aperture Spectral Imaging: An introduction" IEEE Signal Processing Magazine, Jan. 2014, 31(1):105-115, 11 pages.

(Continued)

*Primary Examiner* — Gary C Vieaux
(74) *Attorney, Agent, or Firm* — Fish & Richardson P.C.

(57) ABSTRACT

An imaging device includes an optical element including a transparent substrate, and a plurality of structures disposed on or in the transparent substrate in a plane direction of the transparent substrate, an imaging element in which a plurality of pixels including photoelectric conversion elements are disposed, and a signal processing unit configured to generate an image signal based on an electrical signal acquired from the imaging element, wherein the optical element forms an image in which a point spread function of each wavelength is convoluted on a plurality of pixels corresponding to each polarized light component depending on polarized light components by outputting light in a state in which the optical element has different point spread functions for respective wavelengths, the plurality of structures have the same height in a side view, and the signal processing unit reconstructs an image in which a point spread function is convoluted.

8 Claims, 55 Drawing Sheets

(51) Int. Cl.
  *H04N 23/55*  (2023.01)
  *G02B 1/00*  (2006.01)

(56) References Cited

U.S. PATENT DOCUMENTS

| | | |
|---|---|---|
| 2019/0228507 A1 | 7/2019 | Menon et al. |
| 2020/0301053 A1 | 9/2020 | Wang et al. |
| 2021/0037219 A1 | 2/2021 | Colburn et al. |
| 2021/0127101 A1* | 4/2021 | Roh .................. H04N 23/55 |
| 2021/0333151 A1 | 10/2021 | Miyata et al. |

FOREIGN PATENT DOCUMENTS

| | | | |
|---|---|---|---|
| JP | 6857163 B2 * | 4/2021 | ............... G01J 4/04 |
| WO | WO 2019148200 | 8/2019 | |
| WO | WO 2020066738 | 4/2020 | |

OTHER PUBLICATIONS

Sogabe et al., "ADMM-Inspired Reconstruction Network for Compressive Spectral Imaging," 2020 IEEE International Conference on Image Processing (ICIP), Abu Dhabi, United Arab Emirates, Oct. 25-28, 2020, 2865-2869, 5 pages.

Jeon et al., "Compact Snapshot Hyperspectral Imaging with Diffracted Rotation," ACM Trans. Graph., Jul. 2019, 38(4):117, 13 pages.

* cited by examiner

INPUT SPECTRAL IMAGE: REAL IMAGE
(128 × 128 × 25)

IMAGE AFTER CONVOLUTION:
OBSERVATION IMAGE
(128X128X3; COMPRESSION RATIO 12%)

REAL IMAGE

RECONSTRUCTED IMAGES
(PSNR=29.10dB/SSIM=
0.9176/SAM=0.1874)

Fig. 40

|  | N=1 | N=2 | N=3 | N=4 | Fresnel |
|---|---|---|---|---|---|
| PSNR(dB) | 29.13 | 28.90 | 29.11 | 28.87 | 28.55 |
| SSIM | 0.9212 | 0.9190 | 0.9187 | 0.9165 | 0.9070 |
| SAM | 0.1926 | 0.1863 | 0.1877 | 0.1929 | 0.2199 |

HYPERSPECTRAL IMAGING DEVICE CAPABLE OF ACQUIRING POLARIZATION INFORMATION AND OPTICAL ELEMENT THEREOF

CROSS-REFERENCE TO RELATED APPLICATIONS

This application is a National Stage application under 35 U.S.C. § 371 of International Application No. PCT/JP2021/002909, having an International Filing Date of Jan. 27, 2021. The disclosure of the prior application is considered part of the disclosure of this application, and is incorporated by reference in its entirety into this application.

TECHNICAL FIELD

The present invention relates to an imaging device and an optical element.

BACKGROUND ART

In general, an imaging device acquires a two-dimensional image of three colors in which optical information that can be acquired is R (red), G (green), and B (blue). On the other hand, in recent years, a hyperspectral camera has been put into practical use as a camera for acquiring more detailed color information (wavelength spectrum), and efforts have been made to extract new valuable information from a wider variety of optical information.

Further, a polarizing image sensor for acquiring polarization information which is important optical information like wavelengths has also been put into practical use, and a technique for extracting new valuable information from a wider variety of optical information has been proposed. Therefore, in recent years, it has been desired to realize a hyperspectral imaging device capable of acquiring polarization information.

CITATION LIST

Non Patent Literature

[NPL 1] Gonzalo R Arce, David J Brady, Lawrence Carin, Henry Arguello, and David S Kittle, "Compressive Coded Aperture Spectral Imaging: An introduction", IEEE Signal Processing Magazine, Vol. 31, No. 1, pp. 105-115, 2013.
[NPL 2] Y. Sogabe, et al. "ADMM-INSPIRED RECONSTRUCTION NETWORK FOR COMPRESSIVE SPECTRAL IMAGING", In: 2020 IEEE International Conference on Image Processing (ICIP). IEEE, 2020. p. 2865-2869.

SUMMARY OF INVENTION

Technical Problem

In general, a hyperspectral camera in practical use is of a line scan type and acquires a spectral image by performing imaging a plurality of times using a line scan mechanism and a spectroscopic element. In addition, in order to simultaneously acquire polarization information, it is theoretically possible to combine an existing hyperspectral camera with an existing polarization image sensor. However, when an existing hyperspectral camera is combined with an existing polarization image sensor, there is a problem that the device becomes more complicated.

An object of the present invention in view of the aforementioned circumstances is to provide a hyperspectral imaging device having a simple device configuration and capable of acquiring polarization information, and an optical element for realizing a hyperspectral imaging device having a simple device configuration and capable of acquiring polarization information.

Solution to Problem

To solve the above-described problems and accomplish the object, the imaging device according to the present invention includes: an optical element including a transparent substrate and a plurality of structures disposed on or in the transparent substrate in a plane direction of the transparent substrate; an imaging element in which a plurality of pixels including photoelectric conversion elements are disposed; and a signal processing unit configured to generate an image signal based on an electrical signal acquired from the imaging element, wherein the optical element forms an image in which a point spread function of each wavelength is convoluted on a plurality of pixels corresponding to each polarized light component depending on polarized light components by outputting light in a state in which the optical element has different point spread functions for respective wavelengths, the plurality of structures have the same height in a side view, and the signal processing unit reconstructs an image in which a point spread function of each wavelength is convoluted for each polarized light component.

The optical element according to the present invention is an optical element including a transparent substrate, and a plurality of structures disposed on or in the transparent substrate in a plane direction of the transparent substrate, wherein the optical element forms an image in which a point spread function of each wavelength is convoluted by outputting light having a different condensing intensity distribution for each wavelength on a plurality of pixels corresponding to each polarized component according to the polarized component, and the plurality of structures have the same height in a side view.

Advantageous Effects of Invention

According to the present invention, it is possible to realize a hyperspectral imaging device having a simple device configuration and capable of acquiring polarization information.

BRIEF DESCRIPTION OF DRAWINGS

FIG. 40 is a diagram showing results of comparison of reconstruction accuracy for each shape of a PSF of a lens.

DESCRIPTION OF EMBODIMENTS

Figure 1:
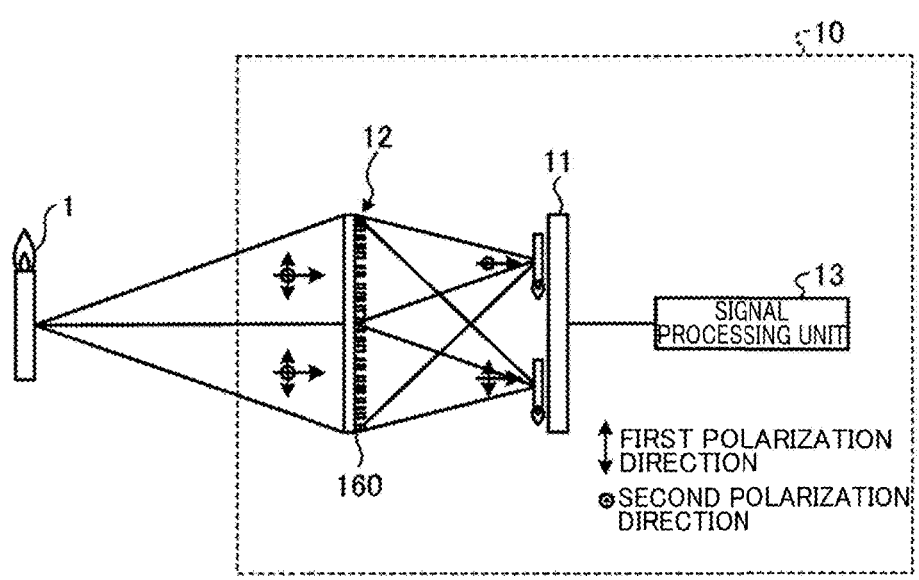
FIG. 1 is a side view showing a schematic configuration of an imaging device according to an embodiment.

The most appropriate embodiment according to the present invention will be described below with reference to the drawings. Note that, in the following description, shape, size, and positional relationship are roughly illustrated for facilitating the understanding of contents of the present invention, therefore the present invention is not limited to the illustrated shape, size, and positional relationship in the drawings. In addition, in the description of the drawings, like elements are designated with like reference numerals. In the following, denotation "^A" for A is assumed to be equivalent to "A with ^ directly above."

Embodiment

Figure 2:
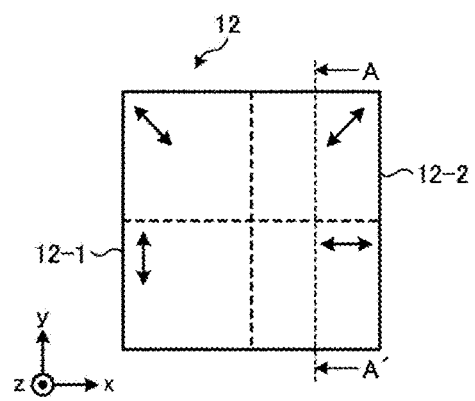
FIG. 2 is a diagram illustrating a configuration of a lens shown in FIG. 1.
Figure 3:
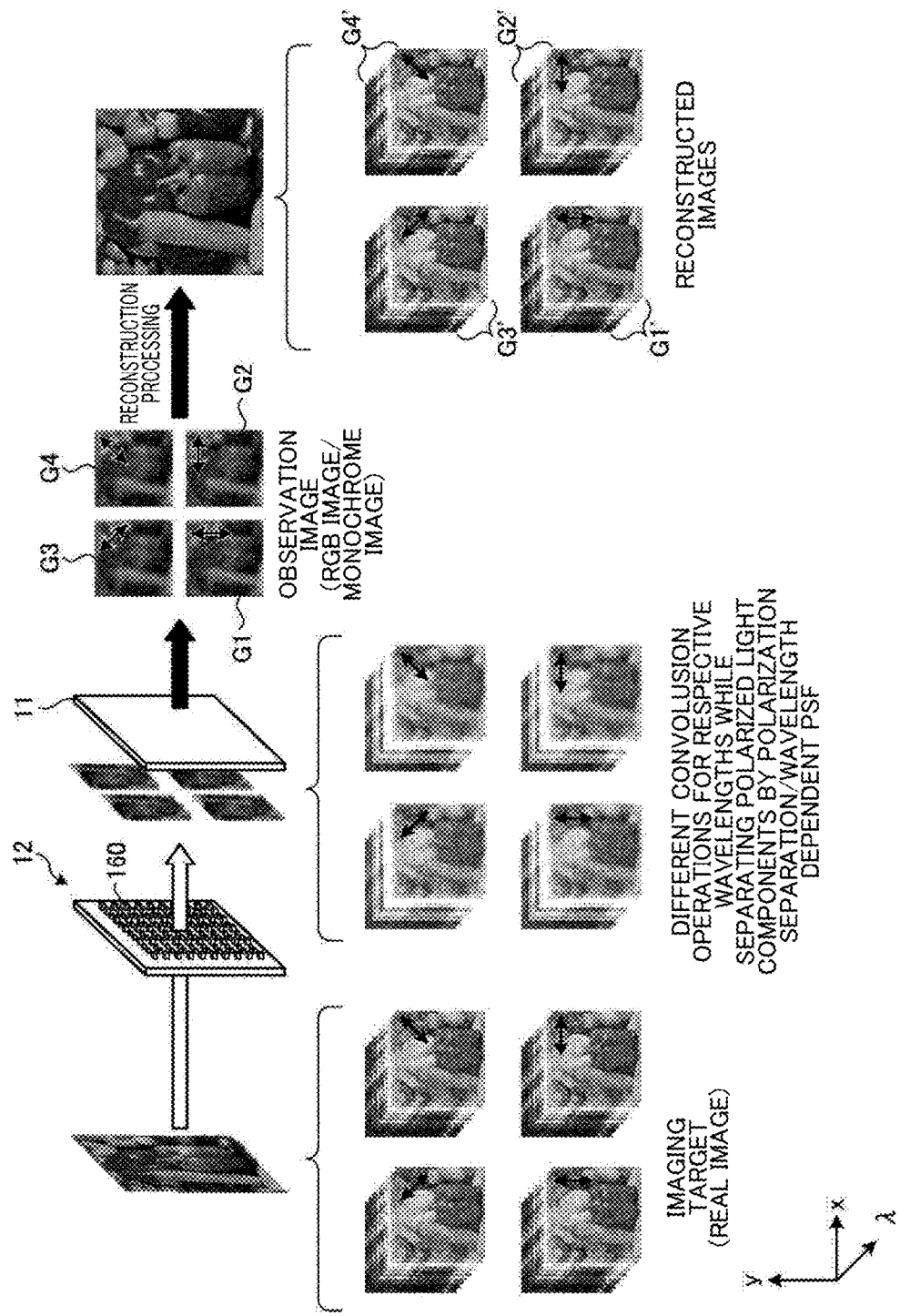
FIG. 3 is a schematic diagram showing processing until the imaging device shown in FIG. 1 acquires an image.

[Imaging device] First, an imaging device according to an embodiment of the present invention will be described below. FIG. 1 is a side view showing a schematic configuration of an imaging device according to an embodiment. FIG. 2 is a diagram illustrating a configuration of an optical element 12 shown in FIG. 1. FIG. 3 is a schematic diagram showing processing until the imaging device 10 shown in FIG. 1 acquires an image.

As shown in FIG. 1, the imaging device 10 according to an embodiment includes the optical element 12, an imaging element 11, and a signal processing unit 13. The imaging element 11 has a photoelectric conversion element, such as a CCD or a CMOS. The signal processing unit 13 processes a photoelectric conversion signal that is output from the imaging element 11 to generate an image signal.

As shown in FIG. 1 and FIG. 2, in the imaging device 10, light such as natural light or illumination light is radiated to an imaging target (real image), and light transmitted/reflected/scattered from the imaging target 1 or light emitted from the imaging target 1 forms an optical image on the imaging element 11 through the optical element 12.

The optical element 12 has a function of varying an imaging position according to polarization information and varying imaging characteristics according to wavelength. The optical element 12 has a micro-binary structure. The optical element 12 has a plurality of micro-columnar structures 160 which are arranged at an interval equal to or less than the wavelength of incident light and have a constant height in a side view.

Each of the cross sections of the plurality of micro-columnar structures 160 has a 2-order rotationally symmetrical shape, and polarization dependency can be realized by this shape. For example, in the optical element 12, a first lens pattern region 12-1 for separating linearly polarized light of 0° (horizontal) and linearly polarized light of 90° (vertical) and a second lens pattern region 12-2 for separating linearly polarized light of +45° (diagonal) and linearly polarized light of −45° (diagonal) (refer to FIG. 2) form a pair, and simultaneously, polarized light components in the four directions are separated. The optical element 12 has an imaging (condensing) position varying according to a polarization direction.

Further, the optical element 12 has a function of varying imaging characteristics according to the wavelength, thereby performing optical encoding. Therefore, the optical element 12 is a lens (wavelength dependent PSF lens) having a point spread function (PSF) with a distinctly different shape depending on wavelength, and has a function of generating an image obtained by performing a different convolution operation for each wavelength on a real image (subject). The optical element 12 is a wavelength dependent PSF lens and has a function of imaging an image (acquired observation image (encoded image)) in which a PSF of each wavelength is convoluted, on a plurality of pixels corresponding to each polarization direction in the imaging element 11 according to the polarization direction. That is, when an object is imaged by this optical element 12, a convolution operation is performed by a different PSF for each wavelength with respect to a real image in a polarization change direction, and the result thereof is imaged on a region corresponding to each polarization direction in the imaging element 11.

Light from the imaging target 1 is imaged at different positions by the optical element 12 in a state where polarized light components are separated, and imaging characteristics (a degree of blurring) vary according to wavelength. The optical element 12 performs a different convolution operation for each wavelength while separating polarized light components.

The imaging element 11 acquires an observation image on which a different convolution operation for each wavelength has been performed by the optical element 12, which is a polarization separation/wavelength dependent PSF lens, for each polarization direction. For example, as shown in FIG. 3, an image G1 corresponding to a polarized light component of 90°, an image G2 corresponding to a polarized light component of 0°, an image G3 corresponding to a polarized light component of −45°, and an image G4 corresponding to a polarized light component of 45° (refer to FIG. 3), in which a PSF of each wavelength is convoluted, are formed on the imaging element 11.

The signal processing unit 13 generates a reconstructed image in which spectrum information has been restored through reconstruction processing for reconstructing an image in which a PSF of each wavelength is convoluted for each polarized light component based on compression sensing. For example, the signal processing unit 13 generates a reconstructed image G1' corresponding to the polarized light component of 90°, a reconstructed image G2' corresponding to the polarized light component of 0°, a reconstructed image G3' corresponding to the polarized light component of −45°, and a reconstructed image G4' corresponding to the polarized light component of 45° through reconstruction processing.

Although the imaging device 10 may include known constituent elements such as an optical filter for cutting infrared light, an electronic shutter, a view finder, a power source (battery), and a flashlight, description thereof is omitted because the description is not particularly necessary for understanding of the present invention. The foregoing configuration is merely exemplary, and known elements may be properly used in combination as constituent elements other than the optical element 12, the imaging element 11, and the signal processing unit 13 in the embodiment.

Figure 4:
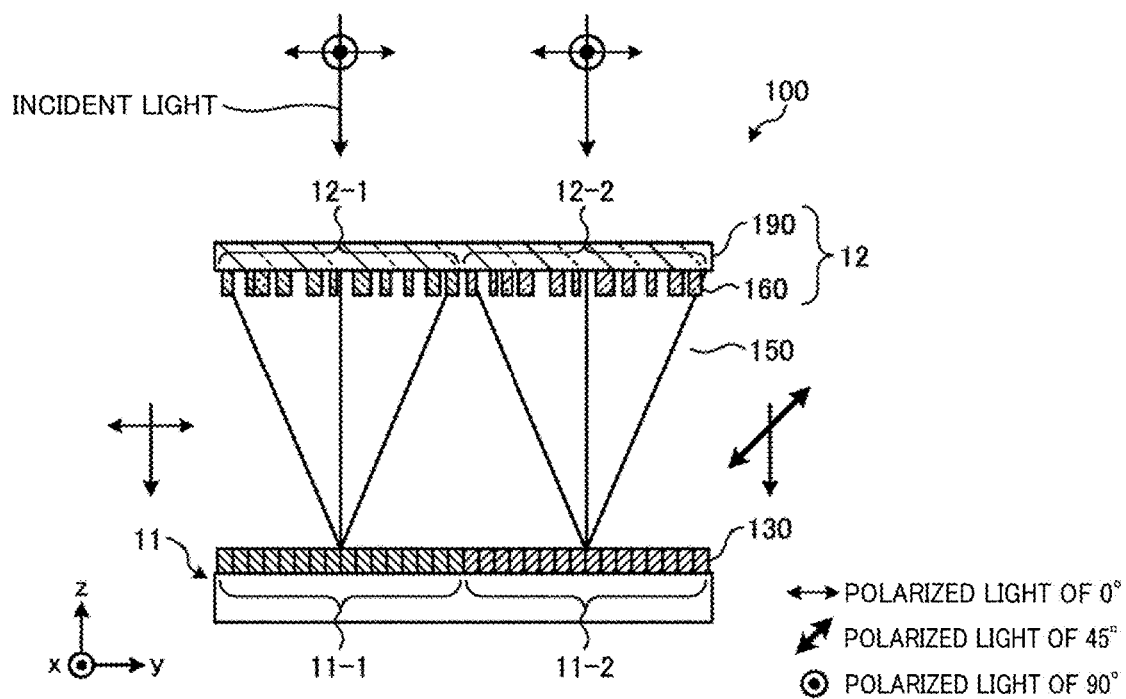
FIG. 4 is a diagram schematically showing parts of cross sections of an imaging element and a lens according to an embodiment.

[Lens and imaging element] Subsequently, the outline of the optical element 12 and the imaging element 11 in the embodiment will be described below. FIG. 4 is a diagram schematically showing a part of the cross sections of the imaging element 11 and the optical element 12 according to the embodiment.

In FIG. 4, a part of the imaging element 11 and the optical element 12 will be described as an imaging unit 100. The imaging unit 100 shown in FIG. 4 is a cross-sectional view taken along line A-A' shown in FIG. 2 when the optical element 12 shown in FIG. 2 is applied. In FIG. 4 and the following figures, the XYZ coordinate system is shown. The X-Y plane direction corresponds to the plane direction of the imaging element 11, a transparent substrate 190 and the like which will be described later. Hereinafter, "planar view" indicates viewing in a z-axis direction (for example, in a negative z-axis direction) unless otherwise specified. "Side view" indicates viewing in an x-axis direction or a y-axis direction (for example, in a negative y-axis direction). In the imaging unit 100, a first lens pattern region 12-1 for separating linearly polarized light of 0° (horizontal) and linearly polarized light of 90° (vertical) and a second lens pattern region 12-2 for separating linearly polarized light of +45° (diagonal) and linearly polarized light of −45° (diagonal) form a pair.

As shown in FIG. 4, in the imaging unit 100, the optical element 12 and the imaging element 11 are arranged opposite to each other. The imaging element 11 and the optical element 12 are provided in this order in a positive z-axis direction.

In the imaging element 11, a plurality of pixels 130 each including a photoelectric conversion element are arranged in a two-dimensional array. An example of the photoelectric conversion element is a photodiode (PD). The pixels correspond to red (R), green (G), and blue (B). An example of the wavelength band of red light is 600 nm<$\lambda_0$≤800 nm where $\lambda_0$ is a wavelength. An example of the wavelength band of green light is 500 nm<$\lambda_0$≤600 nm. An example of the wavelength band of blue light is less than $\lambda_0$≤500 nm. The pixels R, G and B may be a Bayer array. Alternatively, the pixels may be used for monochrome images.

Incident light propagates along the negative z-axis direction and reaches the imaging element 11 via the optical element 12. Charges generated in each pixel 130 of the imaging element 11 are converted into an electrical signal to be a base of a pixel signal by a transistor which is not shown or the like, and output to the outside of the imaging unit 100 through a wiring layer.

The optical element 12 is arranged on a side on which light from an imaging target is incident. In a planar view, the optical element 12 is provided to cover the imaging element 11. The optical element 12 is composed of a plurality of structures 160 provided on the bottom surface of a transparent substrate 190, for example, periodically (having a periodic structure). The plurality of structures 160 may be arranged at equal intervals or at unequal intervals to facilitate design or the like. The plurality of structures 160 are formed in a transparent layer 150 formed on the imaging element 11 to cover the plurality of pixels.

The transparent substrate 190 is a transparent substrate having a low refractive index made of a material such as $SiO_2$ (refractive index n=1.45), for example. The transparent layer 150 is a transparent layer having a low refractive index made of a material such as air or $SiO_2$. The transparent substrate 190 and the transparent layer 150 may be made of a single material or a plurality of materials in a layered form. In a side view, the plurality of structures 160 have the same height. The plurality of structures 160 have a microstructure pattern formed of materials such as SiN and $TiO_2$ having higher refractive indexes than the transparent layer 150.

An example of the optical element 12 is a metasurface. The metasurface includes a plurality of microstructures (corresponding to the structures 160) having a width equal to or less than the wavelength of light in a planar view and having the same height in a side view. Each cross-sectional shape of the plurality of structures 160 when cut along a plane parallel to the xy plane is a 2-order rotationally symmetrical shape, and polarization dependency can be realized by this shape. The metasurface may have a two-dimensional structure or a three-dimensional structure. The optical element 12 can control a phase and a light intensity according to characteristics of light (wavelength, polarization, and incident angle) simply by changing the pattern of these structures 160. In the case of a three-dimensional structure, a degree of freedom of design is improved more than that of a two-dimensional structure.

The optical element 12 has an imaging (light-condensing) position varying according to polarization direction, and has a different PSF according to a wavelength at each light-condensing point. Accordingly, light from the imaging target 1 is imaged at different positions on the imaging element 11 in a state where polarized light components are separated by the optical element 12 having the polarization separation/wavelength dependent PSF function and acquired as an image (RGB image or monochrome image) having imaging characteristics (degree of blurring) varying according to wavelength.

For example, as shown in FIG. 2, in the optical element 12, the first lens pattern region 12-1 for separating linearly polarized light of 0° and linearly polarized light of 90° and the second lens pattern region 12-2 for separating linearly polarized light of +45° and linearly polarized light of −45° are formed as a pair. Images corresponding to the four polarized light components of 0°, 90°, +45°, and −45° are formed, and a region in which the image corresponding to each polarized light component is formed is set in the imaging element 11. FIG. 4 shows an example in which the image corresponding to the polarized light component of 0° is formed in a region 11-1 of the imaging element 11 and the image corresponding to the polarized light component of +45° is formed in a region 11-2.

Each acquired image corresponds to a result obtained by performing an optical convolution operation for each wavelength on the imaging target (real image) 1 by the polarization separation/wavelength dependent PSF of the optical element 12 and integrating the image along a wavelength dimension on pixels. The imaging unit 100 acquires an image in an optically encoded and compressed state. In a case where the imaging element 11 is a color image sensor, after the convolution operation, multiplication depending on the wavelength sensitivity of R, G, and B pixels of the imaging element 11 is performed, and then integration is performed along the wavelength dimension on the pixels.

Accordingly, in the imaging device 10, an optically encoded image is formed on the imaging element 11 for each polarized light component only by the optical element 12. In other words, in the imaging device 10, the optical element 12 can perform effective encoding in spectral image reconstruction while performing polarization separation. Therefore, the imaging device 10 requires only the optical element 12, the imaging element 11, and the signal processing unit 13, and thus a hyperspectral imaging device having a simple device configuration and capable of acquiring polarization information can be realized.

Further, in the imaging device 10, since the distance between the optical element 12 and the imaging element 11 is determined by the focal length of a lens similarly to a conventional imaging device, the size of the imaging device 10 is equal to that of a conventional camera having the same field F number.

Then, information of the real image can be restored by performing appropriate signal processing on the optically encoded image in the signal processing unit 13 when an observation process is known (here, wavelength sensitivity characteristics of the PSF of the optical element 12 and a sensor).

The imaging device 10 performs signal processing using compression sensing which is a method for reconstructing an object with high accuracy from a small amount of information by particularly using sparsity of a natural image. Since the imaging device 10 can perform different encoding operations on wavelength components of the real image by the wavelength dependent PSF of the optical element 12, the signal processing unit 13 can restore a spectral image by performing reconstruction processing of the image based on compression sensing.

By applying this processing to an observation image of each polarized light component separated for each polarized light component, a spectral image composed of each polarized light component (polarization spectral image) (for example, images G1' to G4' in FIG. 3) can be generated.

In this example, three parameters among four Stokes parameters describing a polarization state can be derived from information on four linearly polarized light components for each wavelength. In addition, depending on a lens pattern and a set thereof, it is also possible to perform polarization separation for each of four or six bases from which all the Stokes parameters can be derived and acquire the full Stokes parameters for each wavelength.

Figure 5:
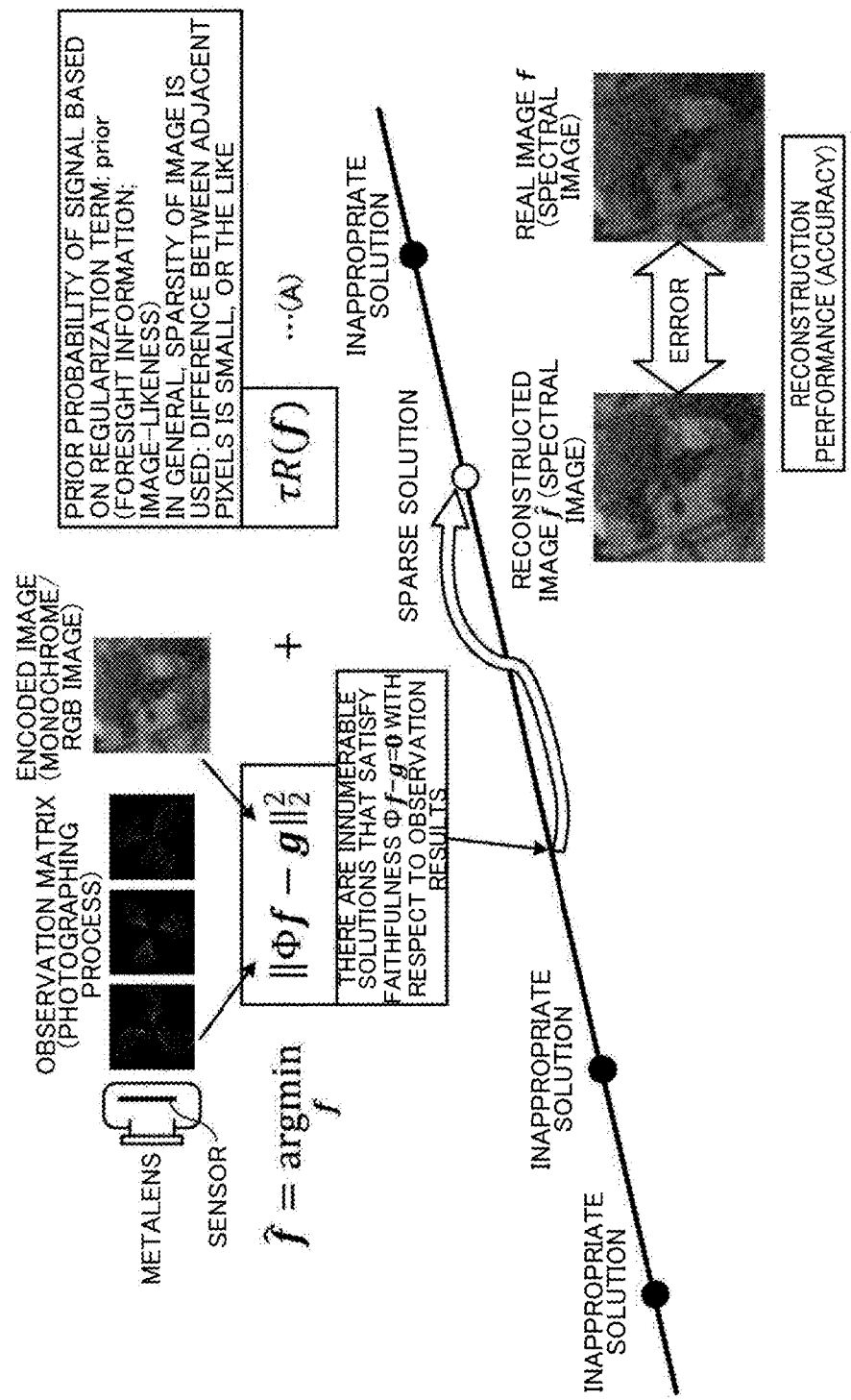
FIG. 5 is a diagram illustrating image reconstruction processing performed by an image by a signal processing unit.

[Image reconstruction processing] The signal processing unit 13 reconstructs an image for each polarized light component based on a matrix defined by an imaging process of the optical element 12 and an image formed on the imaging element 11, that is, an image (encoded image) in which a PSF of each wavelength is convoluted. FIG. 5 is a diagram illustrating image reconstruction processing performed by the signal processing unit 13.

As shown in FIG. 5, reconstruction processing is processing for solving an optimization problem (for example, formula (A) in FIG. 5) in which an observation matrix (defined by an optical system and an acquired encoded image g are input.

In formula (A), f of the first term on the right side indicates an image desired to be restored. Since the number of pieces of data of an observation image is considerably less than the number of pieces of data of the image desired to be restored (reconstructed image), there are numerous solutions satisfying $\Phi f-g=0$, but by adding a normalization term as the second term, it is easy to obtain an image (reconstructed image ^f) which is likely to be a restored image.

Various regularization terms have been proposed for spectral images, and the present embodiment can be applied to any of the normalization terms. In the example of formula (A), R corresponds to a prior probability of a signal based on prior (foresight information: image-likeness), and general sparsity of an image, such as a small difference from an adjacent pixel, is used. Here, T is a balancing parameter. In the present embodiment, a normalization term called Spatio-Spectral Total Variation (SSTV) (Reference 1) is used, and is optimized such that differences between adjacent pixels in a spatial dimension and a wavelength dimension are minimized in image reconstruction.

Reference 1: Aggarwal, H. K., & Majumdar, A. (2016). Hyperspectral image denoising using spatio-spectral total variation. IEEE Geoscience and Remote Sensing Letters, 13(3), 442-446.

Various methods have been proposed for solving the optimization problem. In the present embodiment, for example, a technique called Alternating Direction Method of Multipliers (ADMM) (reference 2) is used. In recent years, there has been proposed a method of simultaneously optimizing a regularization term and parameters of an optimization problem using machine learning or the like and reconstructing an image (refer to NPL 2). This method can be applied to the signal processing unit 13. That is, the signal processing unit 13 may reconstruct a spectral image using a model configured through a neural network and an optimized reconstruction algorithm. In other words, the signal processing unit 13 learns the form of the regularization term and various parameters of the optimization problem in advance using various spectral images through machine learning and reconstructs an image using the trained (optimized) regularization terms and various parameters.

Reference 2: S. Boyd, N. Parikh, E. Chu, B. Peleato and J. Eckstein, "Distributed optimization and statistical learning via the alternating direction method of multipliers," Foundations and Trends in Machine Learning, vol. 3, No. 1, pp. 1-122, 2011.

In this manner, in the imaging device 10, the observation matrix (effective for reconstruction can be realized using the simple and compact optical system (optical element 12).

[One example of structure] In order to realize the structures 160, the optical element 12 that is a polarization separation/wavelength dependent PSF lens and has an imaging position varying according to polarization information and imaging characteristics varying according to wavelength is realized by designing a cross-sectional shape of the micro-columnar structures 160 to design an arbitrary spatial phase distribution in the present embodiment.

Figure 6:
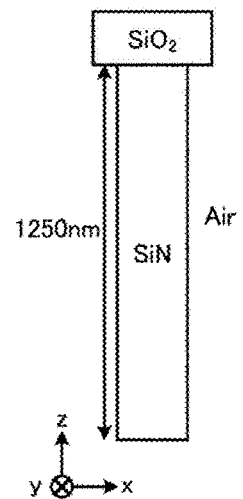
FIG. 6 is a side view of a structure having a square shape in a planar view.
Figure 7:
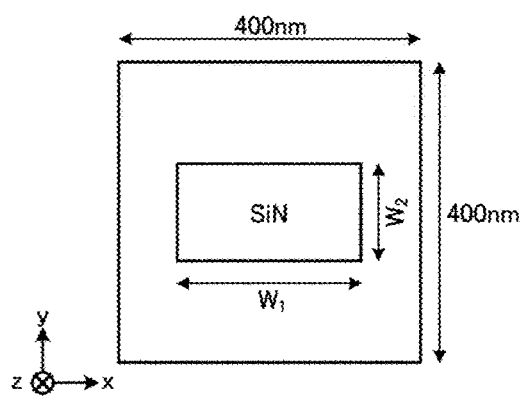
FIG. 7 is a bottom view of the structure shown in FIG. 6.

FIG. 6 and FIG. 7 are diagrams showing an example of a schematic configuration of each structure 160. FIG. 6 is a side view of the structure 160 having a square shape in a planar view. FIG. 7 is a bottom view of the structure 160 shown in FIG. 6.

The structure 160 is a columnar structure extending in the z-axis direction and is formed on a bottom surface of a transparent substrate 190 (for example, an $SiO_2$ substrate (refractive index of 1.45)). An example of the material of the structure 160 is SiN (refractive index $n_1$=2.05). The side and lower part of the structure 160 are air (refractive index $n_0$=1.0).

The arrangement period of the structures 160 is defined as P. It is desirable to set the arrangement period P as represented by formula (1) such that diffracted light is not generated on a transmission side.

[Math. 1]

$$P \leq \lambda_{min}/n_0 \tag{1}$$

$\lambda_{min}$ is the shortest wavelength in the wavelength band of a light receiving target. $n_0$ is the refractive index of a transparent layer on the transmission side. For example, $\lambda_{min}$ is set to 420 nm, $n_0$ is set to 1.0, and P=400 nm.

The height h (length in the z-axis direction) of the structure 160 is constant. Since it is preferable that the structure 160 has an optical phase delay amount (phase value) of $2\pi$ or more with respect to incident light, that is, light traveling along the z-axis direction, it is desirable to set the height h as represented by formula (2) if a desired central wavelength in the wavelength region on the longest wavelength side of a wavelength region to be separated is $\lambda_r$.

[Math. 2]

$$h \geq \lambda_r/(n_1-n_0) \tag{2}$$

In formula (2), $n_1$ is the refractive index of the structure 160. When the structure 160 is SiN, $n_1$=2.05 and the height h is 1,250 nm, for example. The structure 160 may be formed of TiN (refractive index of 2.40).

By designing the cross-sectional shape of the structure 160 (including dimension design), various combinations capable of providing different optical phase delay amounts for light of respective wavelengths can be realized. By diversifying the cross-sectional shape of the structure 160, the number of combinations is increased, and a degree of freedom of design is further improved.

In order to generate polarization dependence, it is desirable that the cross-sectional shape of each of the plurality of structures 160 when cut along a plane parallel to the xy plane is a 2-order rotationally symmetrical shape. Polarization dependence herein refers to a property that it is possible to provide different phase delay amounts to orthogonal linearly polarized light. In the present embodiment, a lens pattern having polarization separation and wavelength dependent PSF is designed using phase values for respective polarized light components depending on dimensional parameters of the cross-sectional shape of the structures 16.

Figure 8:
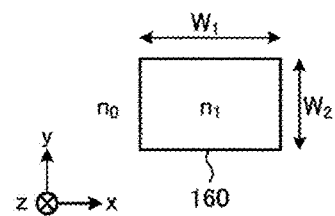
FIG. 8 is a bottom view of the structure.
Figure 9:
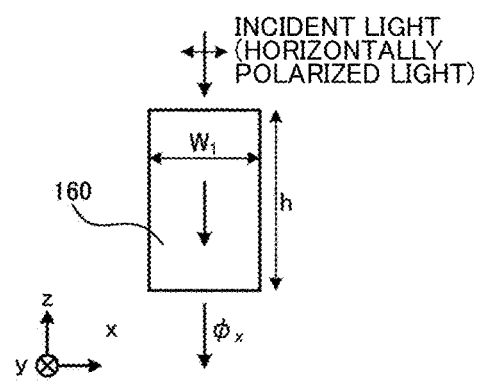
FIG. 9 is a side view of the structure.
Figure 10:
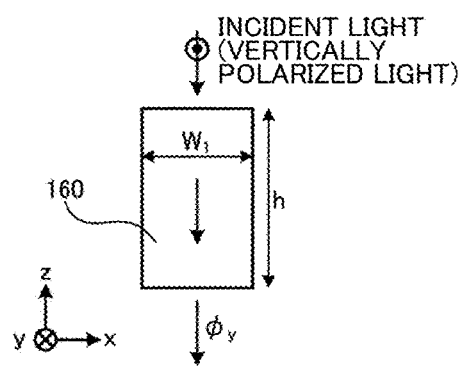
FIG. 10 is a side view of the structure.

[Principle of phase control] FIG. 8 is a bottom view of the structure 160. FIG. 9 and FIG. 10 are side views of the structure. The columnar structure 160 is formed of a material having a refractive index $n_1$ higher than a refractive index no of a material or a space around the structure 160, and the height h of the structure 160 is constant in a side view. In addition, the bottom surface and the top surface of the structure 160 are square.

The structure 160 can operate as an optical waveguide for confining light in the structure and propagating the light therein due to a refractive index difference from the material or the space around the structure 160. Accordingly, light is incident from one side of the structure, the light propagates while being securely confined within the structure 160. Here, the incident light propagates while being affected by a phase delay effect, which is determined by an effective refractive index $n_{eff}$ of the optical waveguide and is finally output from the other side of the structure.

In this case, a phase delay amount p according to the structure is represented by formula (3) when the wavelength of light in vacuum is z with respect to the phase of light which has propagated through the material or space around the structure by a length corresponding to the thickness of the structure.

[Math. 3]

$$\varphi = (n_{eff} - n_0) \times s\pi h / \lambda \quad (3)$$

In formula (3), $n_{eff}$ is a function of the dimension of the structure 160, and it is known that strong polarization dependence occurs depending on the shape of the structure 160. When the structure 160 has a rectangular structure cross section as shown in FIG. 8, it is possible to independently provide different refractive indexes $n_{eff}$ to orthogonal incident polarized light.

Here, a phase delay amount with respect to a polarized light component in the lateral direction (x-axis direction) in FIG. 8 is set to $\varphi_x$, a phase delay amount with respect to a polarized light component in the vertical direction (y-axis direction) is set to $\varphi_y$, an effective refractive index with respect to the polarized light component in the lateral direction is set to $n_{effx}$, an effective refractive index with respect to the polarized light component in the vertical direction is set to $n_{effy}$, the width of a column in a direction parallel to the lateral direction is set to $w_1$, and the width of the column in a direction parallel to the vertical direction is set to $w_2$.

At this time, it is known that the refractive index $n_{effx}$ and the refractive index $n_{effy}$ can be controlled by a combination of $w_1$ and $w_2$, and $n_0 < n_{effx} < n_1$ and $n_0 < n_{effy} < n_1$.

Accordingly, $\varphi_x$ and $\varphi_y$ can be arbitrarily controlled by a combination of $w_1$ and $w_2$. That is, it is possible to arbitrarily set the phase delay amounts $\varphi_x$ and $\varphi_y$ with respect to each polarization direction by designing $w_1$ and $w_2$ which are widths of the structure 160, as illustrated in FIG. 11 to FIG. 16 (which will be described later).

As described above, in the present embodiment, it is possible to provide an arbitrary phase delay spatial distribution in each polarization direction by arranging the columnar structures 160 each having an appropriate width depending on the position on the plane. As a result, in the present embodiment, arbitrary wavefront control can be performed in each polarization direction at a designed wavelength.

[Phase delay amount] Next, the structure width of the structure 160 and a phase delay amount in each type of polarized light will be described. FIG. 11 to FIG. 16 are diagrams showing a relationship between a phase delay amount at each wavelength in each type of polarized light and the structure width of the structure 160. FIG. 11 to FIG. 16 shows phase values of vertically polarized light or horizontally polarized light with wavelength (450, 550, 660 nm) when the structure parameter (width) of the columnar structure 160 is set to various values in a state in which the height is constant.

Figure 11:
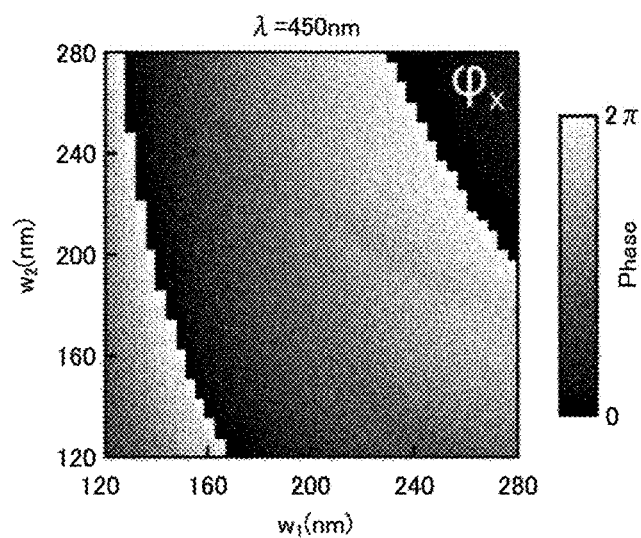
FIG. 11 is a diagram showing a relationship between a phase delay amount and a structure width of a structure at each wavelength in each type of polarized light.
Figure 12:
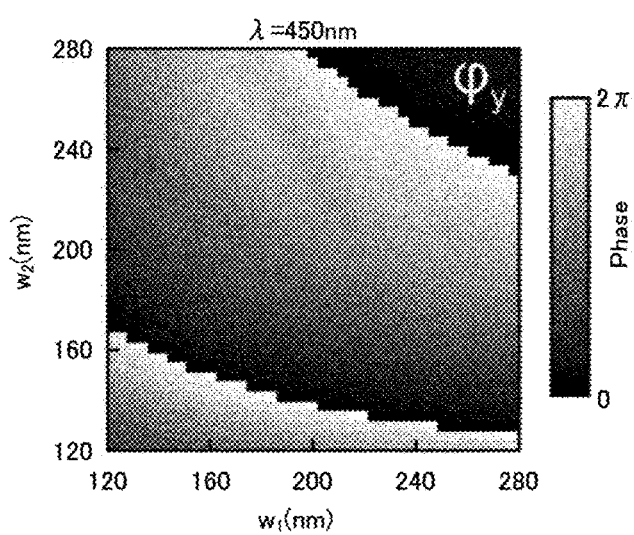
FIG. 12 is a diagram showing a relationship between a phase delay amount and a structure width of a structure at each wavelength in each type of polarized light.
Figure 13:
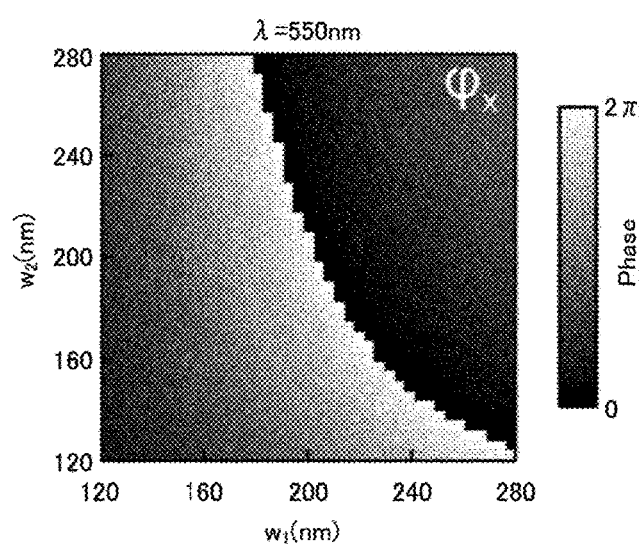
FIG. 13 is a diagram showing a relationship between a phase delay amount and a structure width of a structure at each wavelength in each type of polarized light.
Figure 14:
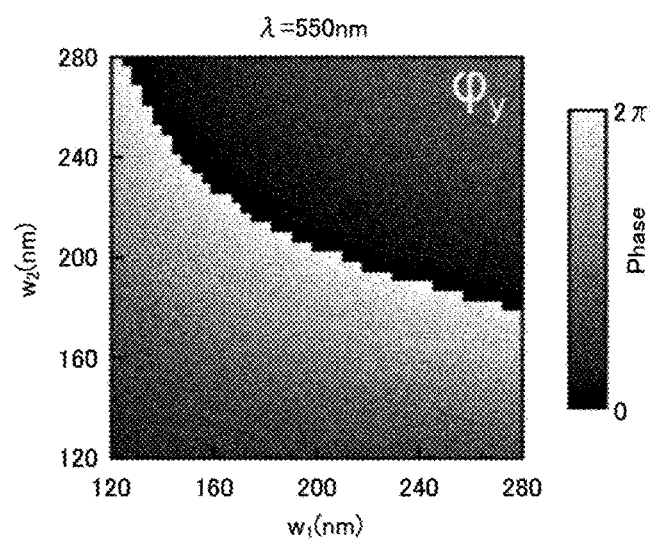
FIG. 14 is a diagram showing a relationship between a phase delay amount and a structure width of a structure at each wavelength in each type of polarized light.
Figure 15:
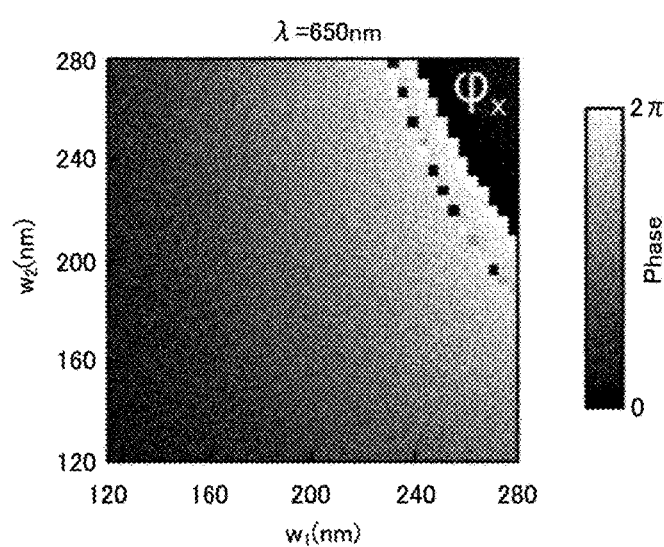
FIG. 15 is a diagram showing a relationship between a phase delay amount and a structure width of a structure at each wavelength in each type of polarized light.
Figure 16:
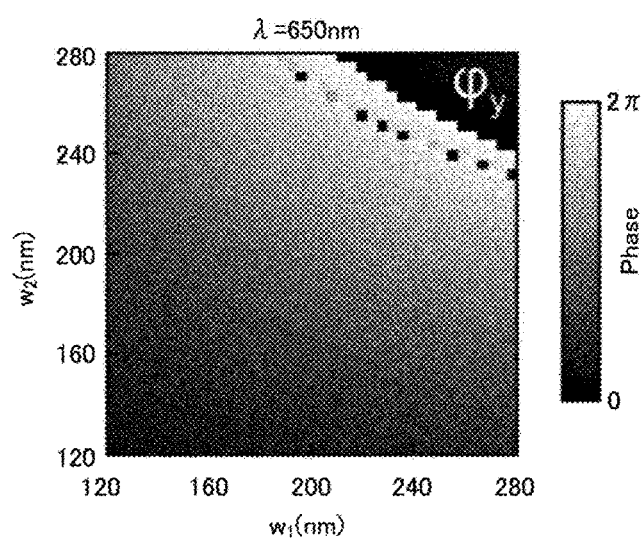
FIG. 16 is a diagram showing a relationship between a phase delay amount and a structure width of a structure at each wavelength in each type of polarized light.

FIG. 11 shows a phase value of horizontally polarized light at a wavelength of 450 nm, and FIG. 12 shows a phase value of vertically polarized light at the wavelength of 450 nm. FIG. 13 shows a phase value of horizontally polarized light at a wavelength 550 nm, and FIG. 14 shows a phase value of vertically polarized light at the wavelength 550 nm. FIG. 15 shows a phase value of horizontally polarized light at a wavelength of 650 nm, and FIG. 16 shows a phase value of vertically polarized light at the wavelength of 650 nm.

As shown in FIG. 11 to FIG. 16, it is possible to realize various combinations of phase values of 0 to 2n in each polarized light with various designed wavelengths by appropriately designing the cross-sectional shape of the structure 160 (including dimension design).

Although the relationship between the phase delay amount and the structure width of the structure 160 has been described with respect to the horizontally polarized light and the vertically polarized light in FIG. 11 to FIG. 16, the present invention is not limited thereto. In the present embodiment, the same design can be applied to any orthogonal polarized light. For example, for control of +45° polarized light and −45° polarized light, the composition structure of the structure 160 shown in FIG. 6 to FIG. 10 may be rotated at 45° on the xy plane. Although FIG. 11 to FIG. 16 show the characteristics of only three wavelengths, the same characteristics can be obtained even at an arbitrary wavelength.

As described above, in the present embodiment, a spatial phase distribution varying according to an arbitrary orthogonal polarization direction can be designed according to designed wavelengths only with a binary structure, and as will be described later, the optical element 12 having PSFs having different shapes for respective wavelengths can be designed while separating polarized light.

Figure 17:
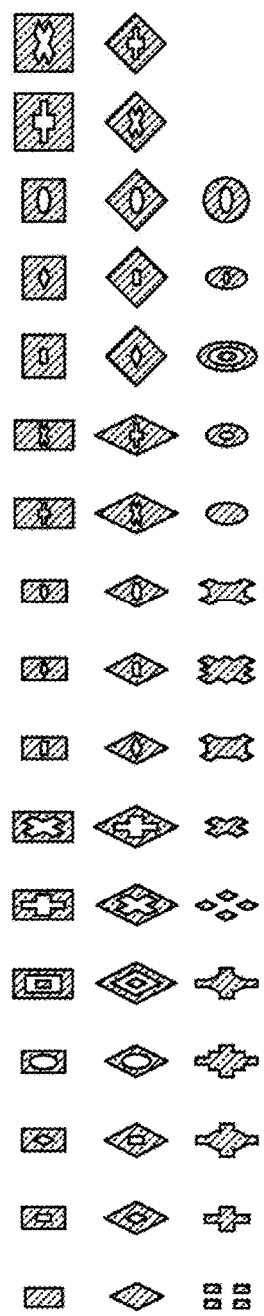
FIG. 17 is a diagram showing examples of a cross-sectional shape of a structure.

The cross-sectional shape of the structure 160 is not limited to the rectangular shape shown in FIG. 7 and FIG. 8. FIG. 17 is a diagram showing examples of the cross-sectional shape of the structure 160. The structure 160 may have various cross-sectional shapes as illustrated in FIG. 17. The illustrated shapes are 2-order rotationally symmetrical shapes obtained by combining, for example, a rectangular shape, a rhombic shape, a cross shape and an elliptical shape in various manners.

[Lens design example 1] Next, an example of design of the optical element 12 which is a polarization separation/wavelength dependent PSF lens will be described. In the present embodiment, a lens phase distribution is designed to converge light at different positions for respective types of polarized lights and have PSFs having different shapes for respective wavelengths and is realized by the columnar structures 160.

Here, a phase distribution is designed using the structures 160 having the SiN composition structure shown in FIG. 6 to FIG. 10, and the optical element 12 having the polarization separation/wavelength dependent PSF function is realized. A lens having PSFs having different shapes for respective wavelengths can be realized from various phase distributions.

As a simplest example, a case of designing the optical element 12 having different PSFs for respective wavelengths based on a phase distribution equivalent to that of the Fresnel lens will be described. In this case, phase distributions $\varphi_x$ and $\varphi_y$ of the lens with respect to orthogonal polarized light (here, horizontally polarized light and vertically polarized light) are represented by, for example, formulas (4) and (5).

[Math. 4]
$$\varphi_x(x, y) = -\frac{2\pi}{\lambda_d} n \left( \sqrt{(x - x_f)^2 + y^2 + z_f^2} - \sqrt{x_f^2 + z_f^2} \right) + C \quad (4)$$

[Math. 5]
$$\varphi_y(x, y) = -\frac{2\pi}{\lambda_d} n \left( \sqrt{(x + x_f)^2 + y^2 + z_f^2} - \sqrt{x_f^2 + z_f^2} \right) + C \quad (5)$$

In formulas (4) and (5), (x, y) represents spatial coordinates on the lens plane. $\lambda_d$ is a designed wavelength. $x_f$ is a focal distance (amount of eccentricity) along the x-axis. $z_f$ is a focal length along the z-axis. n is a refractive index of a light propagation space after light transmitted through the lens. C is an arbitrary constant.

Figure 18:
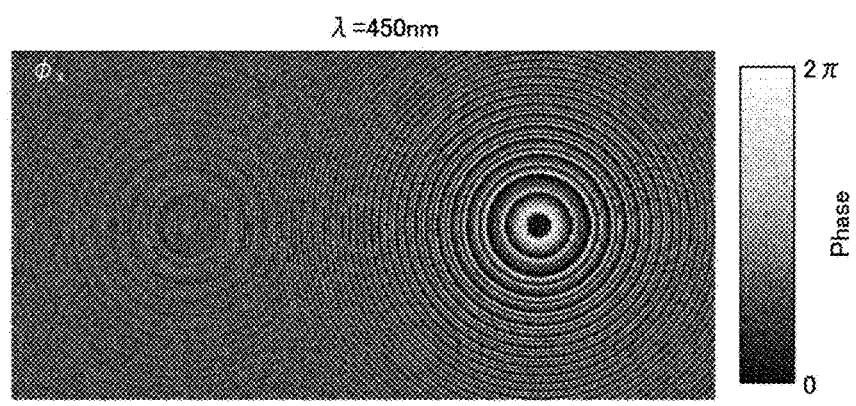
FIG. 18 is a diagram showing an example of a phase distribution for each type of polarized light that a structure has when designed to be equivalent to a Fresnel lens.
Figure 19:
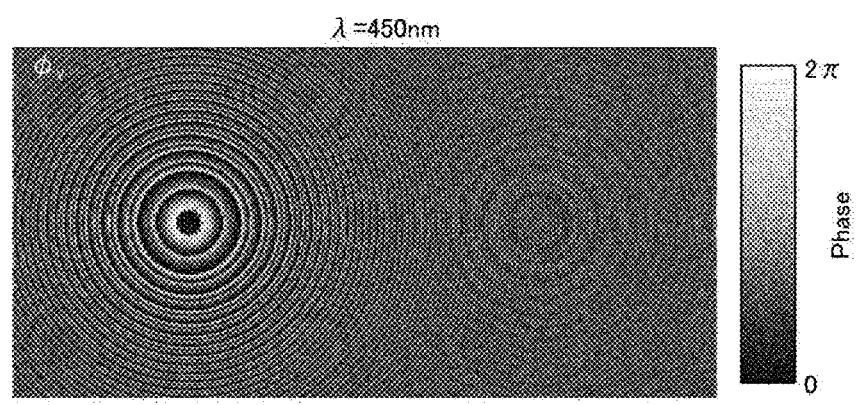
FIG. 19 is a diagram showing an example of a phase distribution for each type of polarized light that a structure has when designed to be equivalent to a Fresnel lens.
Figure 20:
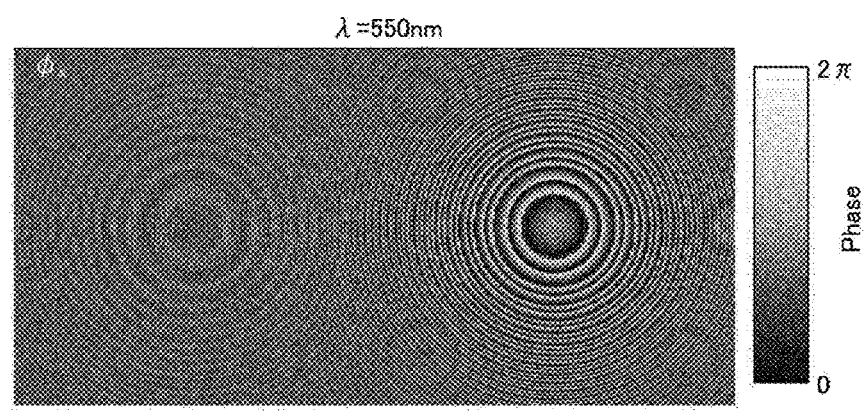
FIG. 20 is a diagram showing an example of a phase distribution for each type of polarized light that a structure has when designed to be equivalent to a Fresnel lens.
Figure 21:
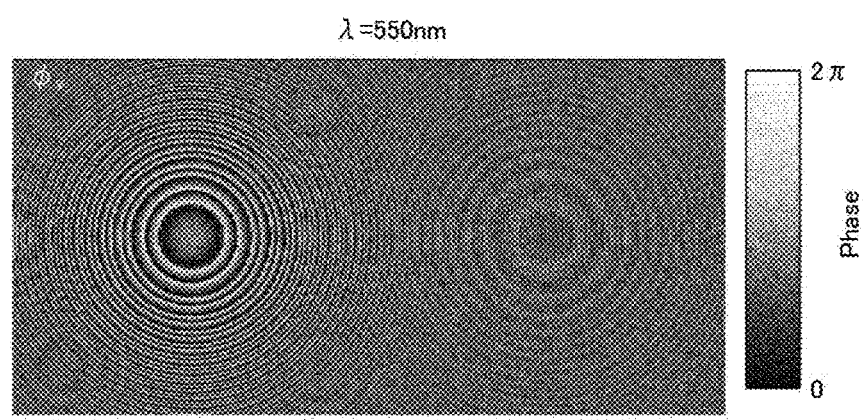
FIG. 21 is a diagram showing an example of a phase distribution for each type of polarized light that a structure has when designed to be equivalent to a Fresnel lens.
Figure 22:
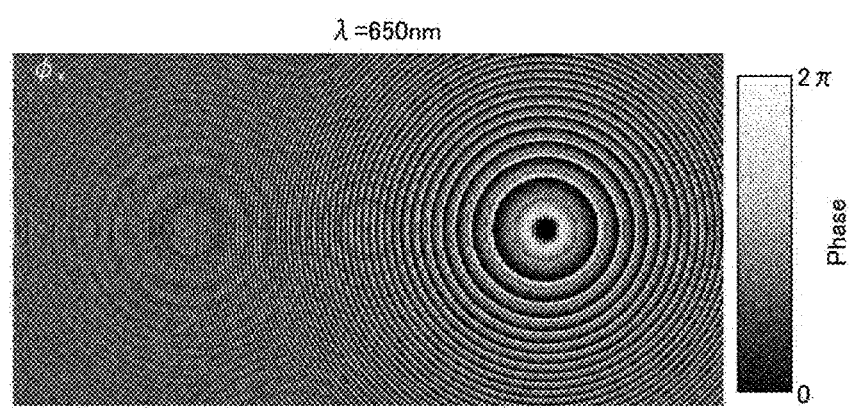
FIG. 22 is a diagram showing an example of a phase distribution for each type of polarized light that a structure has when designed to be equivalent to a Fresnel lens.
Figure 23:
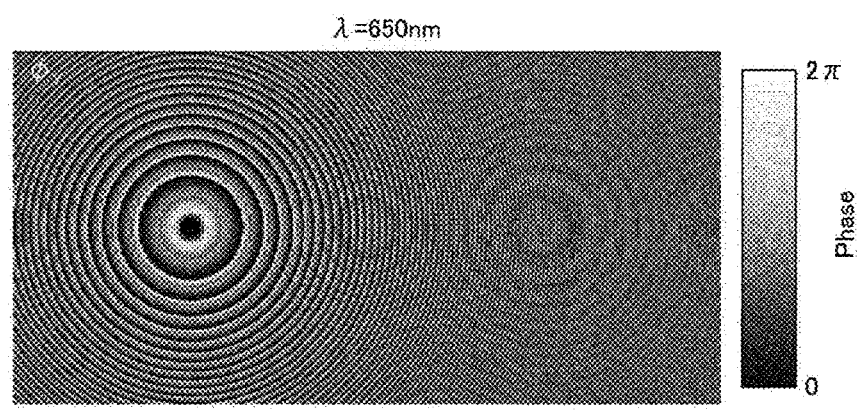
FIG. 23 is a diagram showing an example of a phase distribution for each type of polarized light that a structure has when designed to be equivalent to a Fresnel lens.

FIG. 18 to FIG. 23 are diagrams showing examples of phase distributions of the structures 160 with respect to respective types of polarized lights when the structures 160 are designed to be equivalent to the Fresnel lens. FIG. 18 shows a phase distribution of horizontally polarized light at a wavelength of 450 nm. FIG. 19 shows a phase distribution of vertically polarized light at the wavelength of 450 nm. FIG. 20 shows a phase distribution of horizontally polarized light at a wavelength of 550 nm. FIG. 21 shows a phase distribution of vertically polarized light at the wavelength of 550 nm. FIG. 22 shows a phase distribution of horizontally polarized light at a wavelength of 650 nm. FIG. 23 shows a phase distribution of vertically polarized light at the wavelength of 650 nm.

In the case of the examples shown in FIG. 18 to FIG. 23, the lens was designed with parameters of a lens size of 0.5 mm×1 mm, a focal distance $z_f$ of 5.0 mm, an amount of eccentricity $x_f$ of 0.25 mm, and a designed wavelength of 520 nm. $\varphi$ is transformed such that it falls within the range of 0 to $2\pi$. For example, $-0.5\pi$ and $2.5\pi$ are transformed into $1.5\pi$ and $0.5\pi$, respectively.

In order to realize a polarization separation/wavelength dependent PSF lens having a phase distribution equivalent to that of the Fresnel lens, structures 160 having a structure most suitable for the phase distributions of formulas (4) and (5) (structure in which a phase error in each type of polarized light is minimized) may be selected for each position from a phase delay amount at a designed wavelength of the composition structure and arranged.

In the case of the phase distributions of the lens shown in FIG. 18 to FIG. 23, when parallel light is incident on the optical element 12, the parallel light is separated for each of horizontal and vertical polarized light components and condensed around one point in different focal lengths. In this case, the parallel light with the designed wavelength is condensed at one point in the focal lengths. That is, the PSF shape becomes a dot (precisely, a Gaussian function in the case of a circular lens and a sinc function in the case of a square lens).

Regarding light of other wavelengths, the size of the PSF changes depending on the wavelength due to wavelength dependence of a condensing position caused by a phase pattern and wavelength dispersion with respect to phases of the composition structure. That is, chromatic aberration in which the degree of blurring of an image varies with wavelength is generated.

In the present embodiment, it is possible to sort an imaging target for each type of polarized light component using the polarization separation function and the chromatic aberration, perform different convolution operations for respective wavelengths while imaging the imaging target around different positions, and then generate a spectral image according to image reconstruction at the time of acquiring an image.

Although separation of horizontally polarized light and vertically polarized light has been described in this example, the same design may be used for separation of +45°/−45° polarized light, and if a horizontally/vertically polarized light separation pattern and a +45°/−45° polarized light separation pattern are arranged as one set, the four linearly polarized light components can be classified and imaged (refer to FIG. 2).

[Lens design example 2] Another example of design of the optical element 12 which is a wavelength-dependent PSF lens will be described. Here, an example of a case where a phase distribution is designed to have a propeller-shaped PSF will be described.

That is, the optical element 12 having such a phase distribution that the shape of the PSF rotates in accordance with the wavelength is designed. In this case, when different condensing center positions are set for orthogonal polarized light (here, horizontally polarized light and vertically polarized light), phase distributions $\varphi_x$ and $\varphi_y$ of the lens are represented by, for example, formulas (6) and (7).

[Math. 6]
$$\varphi_{x,y}(x, y) = -\frac{\omega(\theta)}{c} n \left( \sqrt{r^2 + f^2} - f \right) + C \quad (6)$$

-continued

[Math. 7]

$$\begin{aligned}
\omega(\theta) &= \omega_{min} + (\omega_{max} - \omega_{min})\frac{N}{2\pi}\theta & \theta \leq \theta < \frac{2\pi}{N} \\
\omega(\theta) &= \omega_{min} + (\omega_{max} - \omega_{min})\frac{N}{2\pi}\left(\theta - \frac{2\pi}{N}\right) & \frac{2\pi}{N} \leq \theta < \frac{4\pi}{N} \\
&\vdots & \vdots \\
\omega(\theta) &= \omega_{min} + (\omega_{max} - \omega_{min})\frac{N}{2\pi}\left\{\theta - \frac{2\pi}{N}(N-1)\right\} & \frac{2\pi}{N}(N-1) \leq \theta < 2\pi
\end{aligned}\right\} \quad (7)$$

In formulas (6) and (7), r is a distance from the center point on the lens plane (designed condensing center position). C is an angle formed by the designed condensing center position on the lens plane and coordinates. c is the velocity of light in vacuum. ω(θ) is an optical angular frequency at the position of θ. $\omega_{min}$ is a minimum optical angular frequency in design. $\omega_{max}$ is a maximum optical angular frequency in design. f is a focal length. n is a refractive index of a light propagation space after light transmitted through the lens. C is an arbitrary constant. N is the number of blades.

Figure 24:
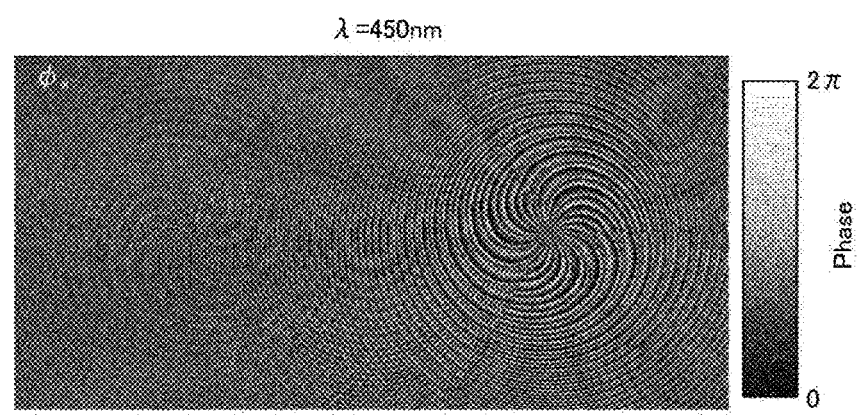
FIG. 24 is a diagram showing an example of a phase distribution for each type of polarized light that a structure has when designed such that a PSF has a propeller shape.
Figure 25:
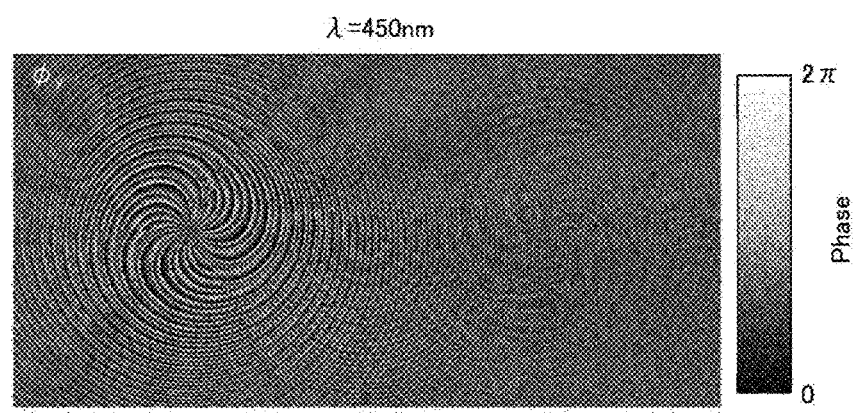
FIG. 25 is a diagram showing an example of a phase distribution for each type of polarized light that a structure has when designed such that a PSF has a propeller shape.
Figure 26:
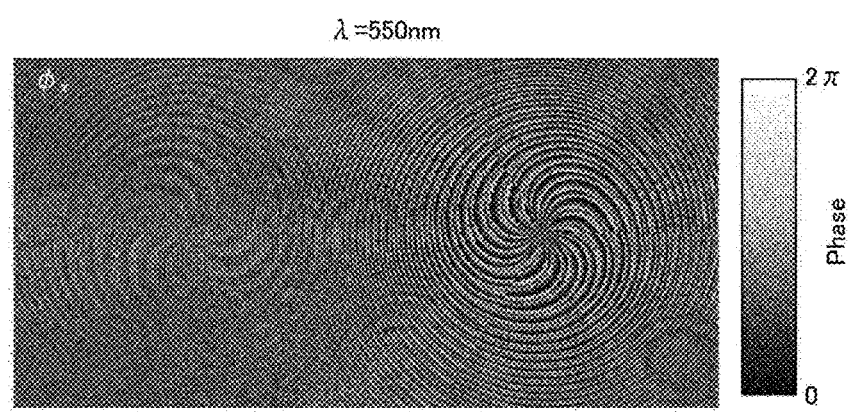
FIG. 26 is a diagram showing an example of a phase distribution for each type of polarized light that a structure has when designed such that a PSF has a propeller shape.
Figure 27:
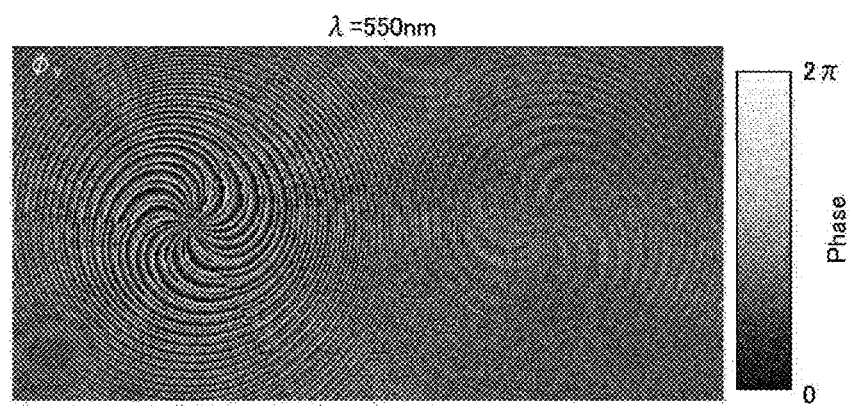
FIG. 27 is a diagram showing an example of a phase distribution for each type of polarized light that a structure has when designed such that a PSF has a propeller shape.
Figure 28:
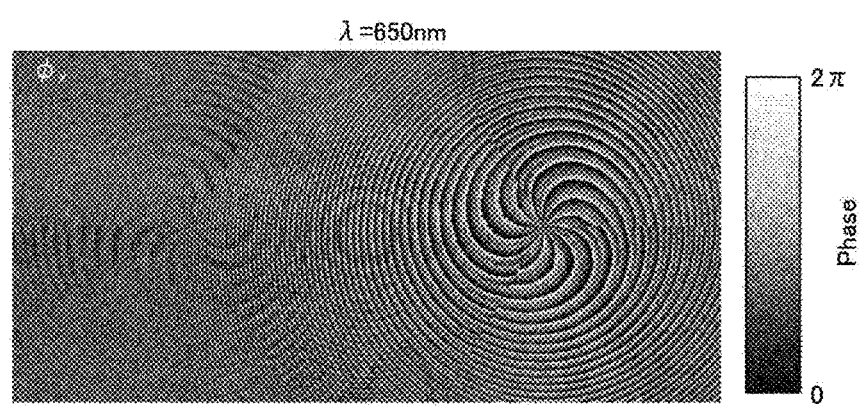
FIG. 28 is a diagram showing an example of a phase distribution for each type of polarized light that a structure has when designed such that a PSF has a propeller shape.
Figure 29:
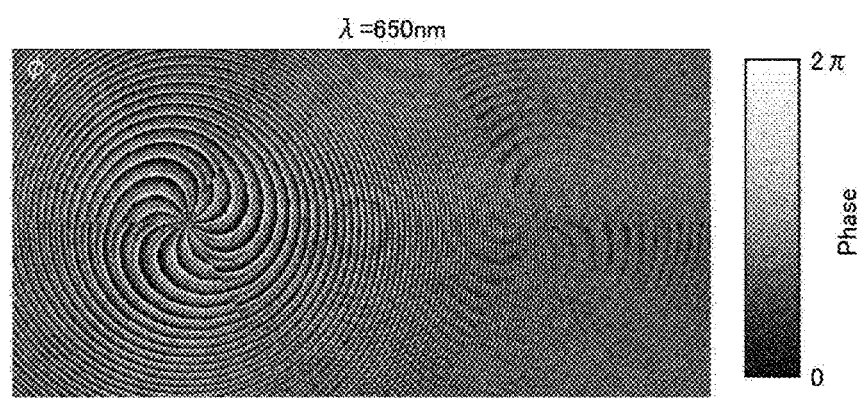
FIG. 29 is a diagram showing an example of a phase distribution for each type of polarized light that a structure has when designed such that a PSF has a propeller shape.

FIG. 24 to FIG. 29 are diagrams showing examples of phase distributions of the structures 160 with respect to respective types of polarized lights when the PSF is designed to have a propeller shape. FIG. 24 shows a phase distribution of horizontally polarized light at a wavelength of 450 nm. FIG. 25 shows a phase distribution of vertically polarized light at the wavelength of 450 nm. FIG. 26 shows a phase distribution of horizontally polarized light at a wavelength of 550 nm. FIG. 27 shows a phase distribution of vertically polarized light at the wavelength of 550 nm. FIG. 28 shows a phase distribution of horizontally polarized light at a wavelength of 650 nm. FIG. 29 shows a phase distribution of vertically polarized light at the wavelength of 650 nm.

In the case of the example shown in FIG. 24 to FIG. 29, the lens was designed with parameters of a lens size of 0.5 mm×1 mm, a focal distance f of 5.0 mm, the number of blades of 3, a designed wavelength of 420 to 660 nm, and condensing positions of horizontally polarized light (+0.25 mm, 0 mm) and vertically polarized light (−0.25 mm, 0 mm). φ is transformed such that it falls within the range of 0 to 2n. For example, −0.5π and 2.5π are transformed into 1.5π and 0.5π, respectively.

In order to realize a polarization separation/wavelength dependent PSF lens having a phase distribution having a propeller-shaped PSF, structures 160 having a structure most suitable for the phase distributions of formulas (6) and (7) (structure in which a phase error in each type of polarized light is minimized) may be selected for each position from a phase delay amount at each wavelength (each angular frequency) of the composition structure and arranged.

In the case of the phase distributions of the lens shown in FIG. 24 to FIG. 29, when parallel light is incident on the optical element 12, the parallel light is separated for horizontal and vertical polarized light components and condensed around one point in different focal lengths. Further, as will be described later, the PSF shape has a shape like a propeller, and the number of blades thereof corresponds to N in formula (7). This PSF shape rotates in accordance with the wavelength, and the size thereof is hardly changed.

This is due to the phase pattern in which the focal length of the lens depends on the wavelength and the rotation angle θ, and wavelength dispersion for the phase of the composition structure. Only light with a designed angular frequency ω(θ) (designed wavelength) at an arbitrary rotation angle θ is condensed at a designed focal length and a focal position, and the focal length of other light changes forward and backward. Since the designed angular frequency ω(θ) linearly changed according to the rotation angle θ, a PSF like a propeller shape is generated and rotates depending on the angular frequency (wavelength).

The optical element 12 can sort the imaging target 1 for each polarized light component utilizing the above-described polarization separation function and wavelength-dependent PSF and perform different convolution operations for respective wavelengths while imaging the imaging target 1 around different positions, and the imaging device 10 can generate a spectral image according to image reconstruction after image acquisition.

As will be described later, a propeller lens type in which the size of the PSF is substantially constant and wavelength dependence is generated in a distinct form of rotation is more advantageous in reconstruction than a Fresnel lens type, and thus is suitable.

Further, although separation of horizontally polarized light and vertically polarized light has been described here, the same design may be used for separation of +45°/−45° polarized light, and a horizontally/vertically polarized light separation pattern and a +45°/−45° polarized light separation pattern are arranged as one set, the four linearly polarized light components can be classified and imaged (refer to FIG. 2).

Further, in formulas (6) and (7), the designed angular frequency ω changes according to the lens position, but the same effect can be obtained even if the angular frequency is replaced with the wavelength.

Although an embodiment of the optical element 12 designed based on the propeller lens type will be described below, the same applies to other wavelength dependent PSF lenses such as a Fresnel lens type.

[Examples of PSF shape] An example of the PSF shape of the polarization separation/wavelength dependent PFS lens in the present embodiment is shown. FIG. 30 to FIG. 36 are diagrams showing PSF shapes at polarized light and wavelengths obtained by Fresnel diffraction integration from the phase distributions shown in FIG. 24 to FIG. 29. In the case of the examples shown in FIG. 30 to FIG. 36, the lens was designed with parameters of a lens size of 1 mm×2 mm, a focal length f of 10 mm, the number of blades of 3, a designed wavelength of 420 to 660 nm, and condensing positions of horizontally polarized light (+0.5 mm, 0 mm) and vertically polarized light (−0.5 mm, 0 mm).

Figure 30:
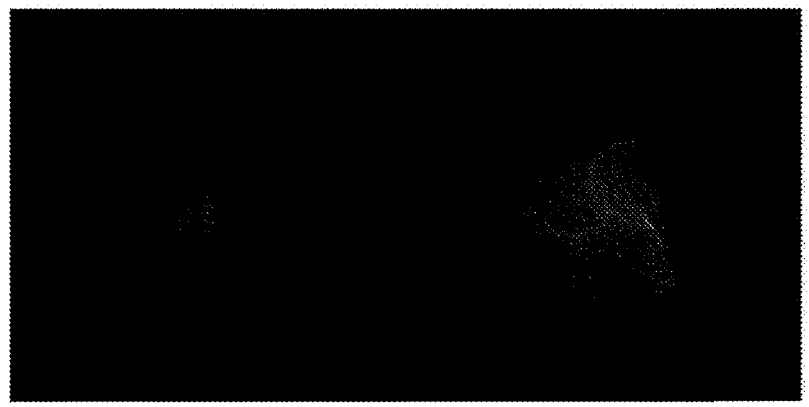
FIG. 30 is a diagram showing a PSF shape at each type of polarized light and each wavelength obtained by Fresnel diffraction integration from the phase distributions shown in FIG. 24 to FIG. 29.
Figure 31:
FIG. 31 is a diagram showing a PSF shape at each polarized light and each wavelength obtained by Fresnel diffraction integration from the phase distributions shown in FIG. 24 to FIG. 29.
Figure 32:
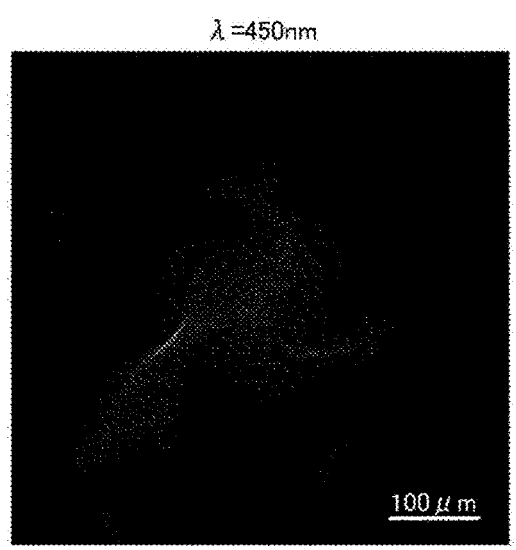
FIG. 32 is a diagram showing a PSF shape at each polarized light and each wavelength obtained by Fresnel diffraction integration from the phase distributions shown in FIG. 24 to FIG. 29.
Figure 33:
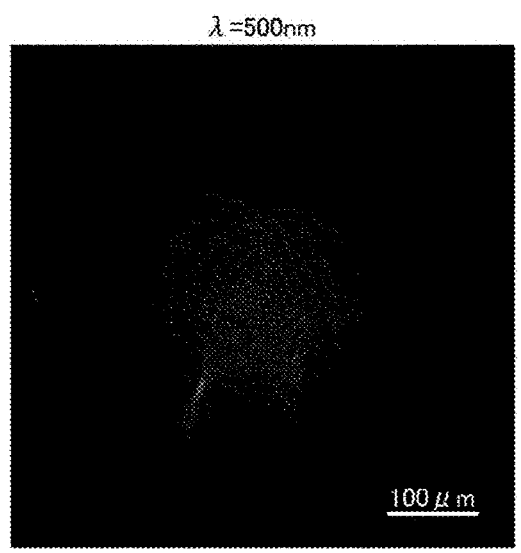
FIG. 33 is a diagram showing a PSF shape at each polarized light and each wavelength obtained by Fresnel diffraction integration from the phase distributions shown in FIG. 24 to FIG. 29.

FIG. 30 shows a PSF shape with respect to horizontally polarized light at a wavelength λ=600 nm. FIG. 31 shows a PSF shape with respect to vertically polarized light at the wavelength λ=600 nm. FIG. 32 to FIG. 36 show PSF shapes with respect to horizontally polarized light and horizontally polarized light near the converging points (+0.5 mm, 0 mm). FIG. 32 shows a PSF shape at a wavelength λ=450 nm. FIG.

Figure 34:
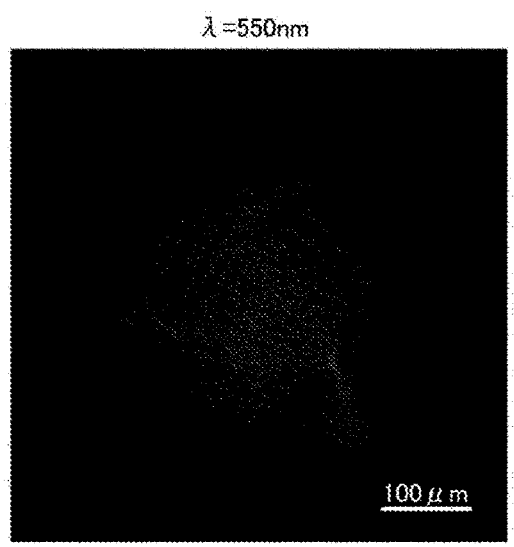
FIG. 34 is a diagram showing a PSF shape at each polarized light and each wavelength obtained by Fresnel diffraction integration from the phase distributions shown in FIG. 24 to FIG. 29.
Figure 35:
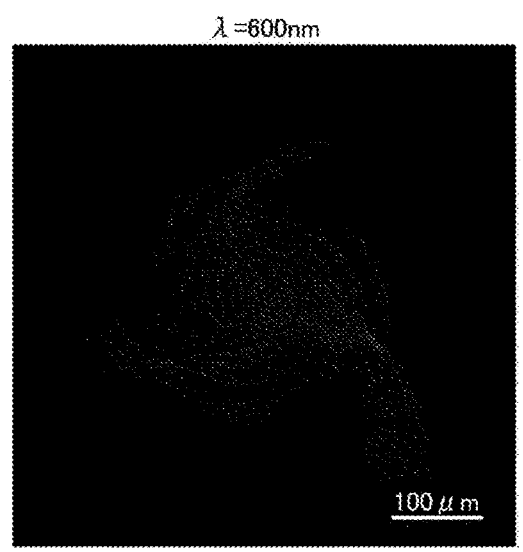
FIG. 35 is a diagram showing a PSF shape at each polarized light and each wavelength obtained by Fresnel diffraction integration from the phase distributions shown in FIG. 24 to FIG. 29.
Figure 36:
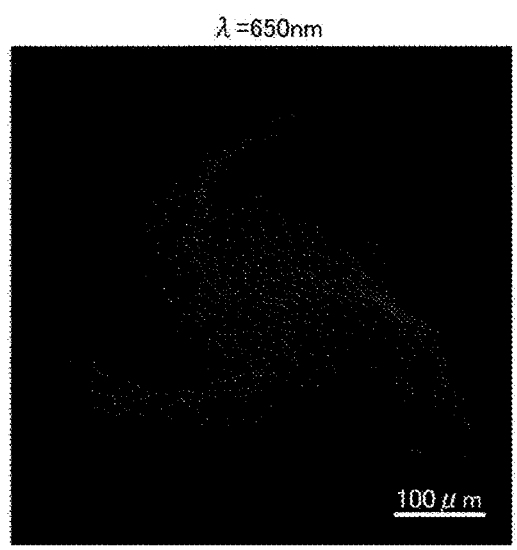
FIG. 36 is a diagram showing a PSF shape at each polarized light and each wavelength obtained by Fresnel diffraction integration from the phase distributions shown in FIG. 24 to FIG. 29.

33 shows a PSF shape at a wavelength λ=500 nm. FIG. 34 shows a PSF shape at a wavelength λ=550 nm. FIG. 35 shows a PSF shape at a wavelength λ=600 nm. FIG. 36 shows a PSF shape at a wavelength λ=650 nm.

As shown in FIG. 30 and FIG. 31, it is ascertained that a condensing position varies depending on polarized light and polarization separation can be realized according to the optical element 12. In addition, according to the optical element 12, propeller-shaped PSFs with three blades are realized and rotate in accordance with the wavelength as shown in FIG. 32 to FIG. 36. As shown in FIG. 32 to FIG. 36, the size of the PSF itself does not substantially change regardless of wavelength change.

When the imaging target 1 is imaged by the optical element 12 having such a PSF, the image is sorted for each polarized light component, and a result of convoluting the image with the PSF of the corresponding wavelength is imaged on the image sensor. Although separation of horizontally polarized light and vertically polarized light has been described in this example, the same results were obtained with respect to separation of +45°/−45° polarized light.

Figure 37:
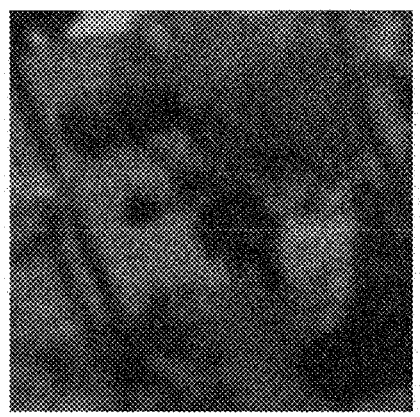
FIG. 37 is a diagram showing simulation results.
Figure 37:

[Example of observation image] Subsequently, simulation results obtained by capturing a natural image using the optical element 12 having the PSFs shown in FIG. 30 to FIG. 36 will be described. FIG. 37 is a diagram showing simulation results.

The simulation was carried out by performing a convolution operation on published spectral images (ICVL, Boaz Arad and Ohad Ben-Shahar. Sparse recovery of hyperspectral signal from natural rgb images, In European Conference on Computer Vision, pp. 19-34. Springer, 2016., [online], [Retrieve on 28 Dec. 2020], Internet <URL: ://icvl.cs.bgu.ac.il/hyperspectral/>) (wavelength 420 nm to 660 nm: 25 bands) with the PSFs of FIG. 30 to FIG. 36 for each wavelength, and performing integration along the wavelength dimension in consideration of the sensitivity of RGB pixels of a general color image sensor. FIG. 37 shows RGB color images displayed in monochrome, an image on the left side is an input spectral image (real image), and an image on the right side is an image (observation image) after convolution formed on the imaging element 11.

This corresponds to simulation of an RGB color image (observation image) captured using a lens having the PSFs shown in FIG. 30 to FIG. 36 and a color image sensor and output from the sensor.

It is assumed that the wavelength region of light of B is 420 to 500 nm, the wavelength region of light of G is 500 to 600 nm, and the wavelength region of light of R is 600 to 660 nm. FIG. 37 shows an image of only one arbitrary polarized light component (horizontally polarized light) as an observation image, and reconstruction processing corresponding to the observation image of the horizontally polarized light will be described hereinafter, but the same applies to other polarized light components.

As shown in FIG. 37, it is ascertained that the observation image is blurred by the convolution operation according to the PSF of the optical element 12. An observed amount of information is compressed to 12% of the real image (3 colors from 25 wavelength bands), and information is restored to 25 wavelength bands from 3 colors by image reconstruction based on compression sensing.

Figure 38:
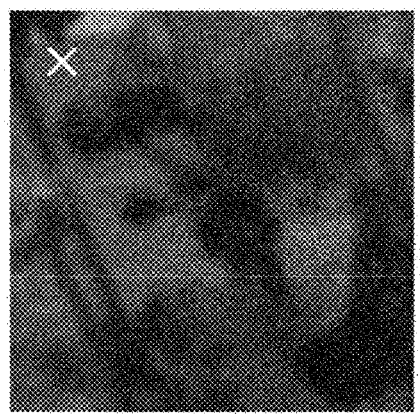
FIG. 38 is a diagram showing an example of a reconstructed image obtained by an imaging device.
Figure 38:

[Restructured image] Next, an example of a reconstructed image obtained by the imaging device 10 will be described. FIG. 38 is a diagram showing an example of a reconstructed image obtained by the imaging device 10. FIG. 38 shows an example of generating a spectral image from the observation image shown in FIG. 37 using reconstruction processing based on compression sensing.

Here, SSTV was used as a regularization term, and ADMM was used as a solution to the optimization problem. Further, FIG. 38 also shows a real image for comparison. Although the reconstructed image and the real image shown in FIG. 38 are spectral images of 25 bands, they are obtained by monochrome display of RGB images for visualization.

The reconstructed images were evaluated with evaluation indexes of Peak Signal-to-Noise Ratio (PSNR), Structural Similarity (SSIM), and Spectral Angle Mapping (SAM).

PSNR is an index for evaluating a difference for each pixel and represents higher image quality as the value thereof increases, as represented by formulas (8) and (9). PSNR of an image of each wavelength was calculated and applied to a spectral image by being averaged over the entire wavelength.

[Math. 8]

$$PSNR = 10 \cdot \log_{10} \frac{MAX_I^2}{MSE} \qquad (8)$$
$$= 20 \cdot \log_{10} \frac{MAX_I}{\sqrt{MSE}}$$

[Math. 9]

$$MSE = \frac{1}{mn} \sum_{i=0}^{m-1} \sum_{j=0}^{n-1} [I(i,j) - K(i,j)]^2 \qquad (9)$$

SSIMS is structural similarity and is an index including correlation with surrounding pixels, as represented by formula (10). As SSIM is closer to 1, image quality increases. SSIM of an image of each wavelength was calculated and applied to a spectral image by being averaged over the entire wavelength.

[Math. 10].

$$SSIM(x, y) = \frac{(2\mu_x\mu_y + c_1)(2\sigma_{xy} + c_2)}{(\mu_x^2 + \mu_y^2 + c_1)(\sigma_x^2 + \sigma_y^2 + c_2)} \qquad (10)$$

SAM is wavelength spectral similarity, and as SAM is closer to 0, spectrums are more similar. SAM of each pixel was calculated and applied to a spectral image by being averaged over the entire image.

The reconstructed image has a PSNR of 29.10 dB, SSIM of 0.9176, and SAM of 0.1874. Therefore, it is ascertained that an image is reconstructed with high accuracy by the imaging device 10.

Figure 39:
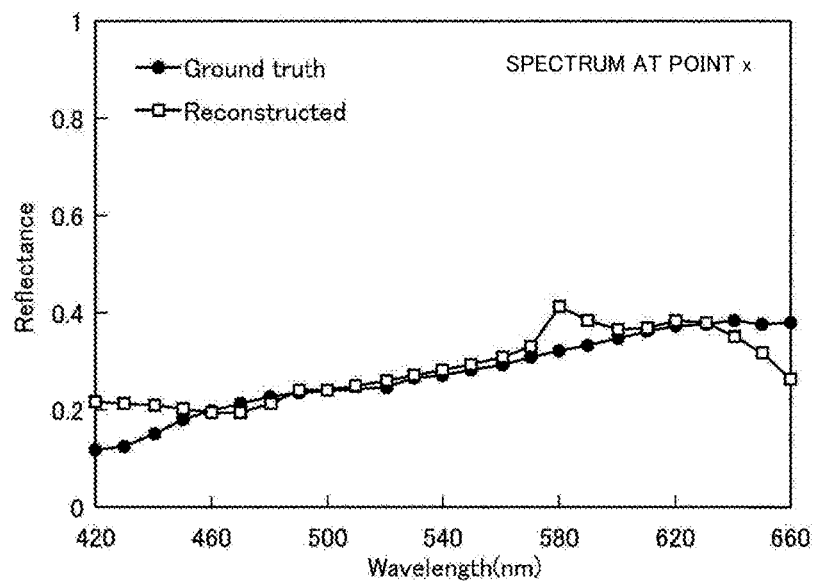
FIG. 39 is a diagram showing a wavelength spectrum at a point x in the reconstructed image in FIG. 38.

[Reconstructed wavelength spectrum] Next, an example of a reconstructed wavelength spectrum will be described. FIG. 39 is a diagram showing a wavelength spectrum at a point x in the reconstructed image in FIG. 38. FIG. 39 also shows a wavelength spectrum at a point x point in a real image (Ground true) along with the reconstructed image (Reconstructed) for comparison.

As shown in FIG. 39, the reconstructed image has a spectrum which is well coincident with the real image, and it is ascertained that highly accurate information restoration can be executed according to image reconstruction. Reconstruction accuracy varies depending on a regularization term and a method of solving the optimization problem in addition to the PSF shape of the optical element 12.

[Reconstruction Accuracy Comparison Depending on PSF Shapes]

Figure 41:
FIG. 41 is a diagram showing reconstructed images reconstructed based on observed images of each shape of the PSF of FIG. 40.

Next, results of comparison of reconstruction accuracies depending on PSF shapes in the optical element 12. FIG. 40 shows results of comparison of reconstruction accuracies for respective PSF shapes of the optical element 12. FIG. 41 is a diagram showing images reconstructed based on observation images with respect to the respective PSF shapes shown in FIG. 40. The reconstructed images, a real image, and a Fresnel lens image shown in FIG. 41 are obtained by monochrome display of RGB images.

FIG. 40 also shows results with respect to a Fresnel lens type PSF for comparison. Further, FIG. 41 also shows a real image and a reconstructed image according to the Fresnel lens type for comparison. An image according to the Fresnel lens type was reconstructed using a large chromatic aberration.

In FIG. 40 and FIG. 41, PSNR, SSIM, and SAM were used as evaluation indexes. In FIG. 40 and FIG. 41, N represents the number of blades. FIG. 40 and FIG. 41 show the results of calculation and evaluation on the assumption of only one polarized light component. Parameters of the lens include a lens size of 0.5 mm×1.0 mm, a focal distance $z_f$ of 5.0 mm, the amount of eccentricity $x_f$ of 0.25 mm, and a designed wavelength band of 420 to 660 nm.

As shown in FIG. 40 and FIG. 41, all evaluation indexes do not have a large difference depending on the number of blades, and show higher accuracy than the Fresnel lens PSF. In other words, the optical element 12 exhibits higher accuracy than the Fresnel lens PSF regardless of the number of blades. Therefore, it can be said that the optical element 12 according to the present embodiment is more suitable than the Fresnel lens type and constitutes an observation matrix advantageous for reconstruction.

[Effects of embodiment] As described above, in the imaging device 10 according to the present embodiment, only the optical element 12 forms an optically encoded image on the imaging element 11 for each polarized light component. In the present embodiment, a hyperspectral camera optical system and a polarization information acquisition optical system are realized as an integral optical element by the optical element 12 which is a metasurface. In other words, in the imaging device 10, it is possible to perform effective encoding in spectral image reconstruction while performing polarization separation only using the optical element 12. Accordingly, components of the imaging device 10 may be only the optical element 12, the imaging element 11, and the signal processing unit 13, and thus a hyperspectral imaging device having a simple device configuration and capable of acquiring polarization information can be realized.

Further, in the imaging device 10, since the distance between the optical element 12 and the imaging element 11 is determined by the focal length of a lens similarly to a conventional imaging device, the size of the imaging device 10 is equal to that of a conventional camera having the same field F number.

Then, information of the real image can be restored by performing appropriate signal processing on the optically encoded image in the signal processing unit 13 when an observation process is known (here, wavelength sensitivity characteristics of the PSF of the optical element 12 and a sensor).

Further, since imaging itself (acquisition of an image separated into respective polarized light components and encoded) may be a single shot in the imaging device 10, time resolution equivalent to that of a normal camera can be achieved without sacrificing the time dimension and excluding reconstruction processing.

Further, since the optical element 12 in charge of polarization separation and encoding is composed of a microbinary structure in the imaging device 10, the manufacturing man-hour can be reduced, the thickness is thin, the weight is light, and manufacturing is easy as compared to a general diffraction optical element that requires multistage lithography.

Further, the optical element 12 having a fine binary structure does not have reduction of light transmittance and limitation on the maximum lens numerical aperture (NA) caused by the shadow effect occurring in a general diffraction optical element (phenomenon that diffracted light by the diffraction optical element is reflected/scattered by its own multi-stage structure), and thus a lens having a higher NA (a bright lens having high light utilization efficiency) can be realized.

Although the present embodiment shows an embodiment based on a case where the imaging element 11 is a color image sensor, even in the case of a monochrome image sensor, the same applies except that 3ch (RGB: color) becomes 1cb (monochrome) at the time of acquiring an encoded image.

[Modified example 1 of embodiment] In the present modified example 1, a modified example in which overlap (crosstalk) of images on pixels of the imaging element 11 can be reduced will be described.

Figure 42:
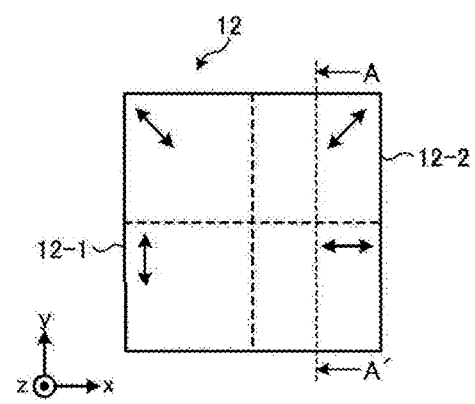
FIG. 42 is a plan view of an imaging unit to which the lens shown in FIG. 1 is applied.
Figure 43:
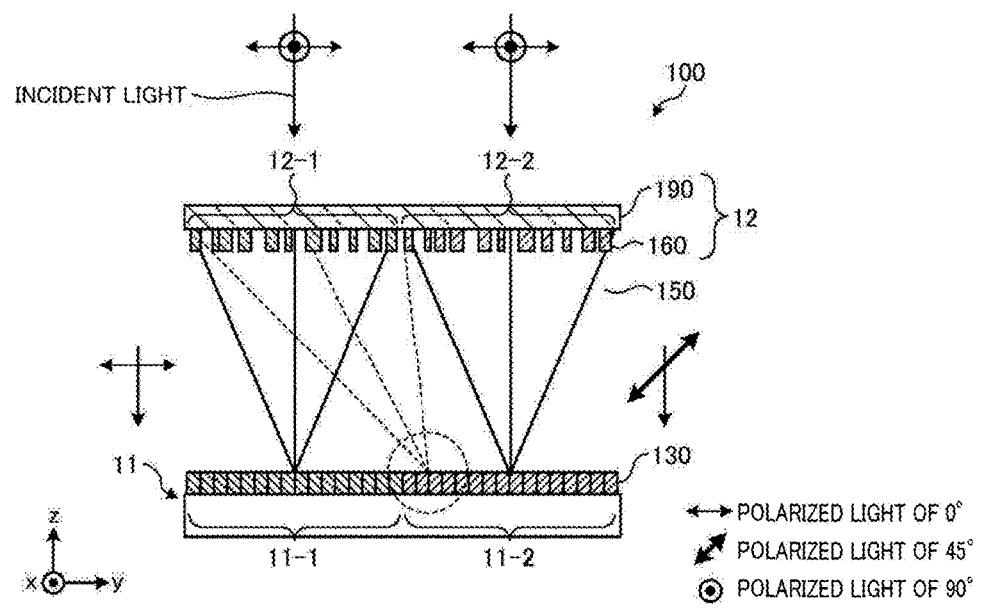
FIG. 43 is a cross-sectional view of the imaging unit along line A-A' of FIG. 42.

In the present modified example 1, a part of the imaging element 11 and the optical element 12 is described as an imaging element. FIG. 42 is a plan view of an imaging unit to which the optical element 12 shown in FIG. 1 is applied. The transparent substrate 190 is omitted. FIG. 43 is a cross-sectional view of the imaging unit taken along line A-A' of FIG. 42.

As shown in FIG. 42 and FIG. 43, there is a concern that overlap (crosstalk) of images occurs in the vicinity of the boundary of images (the vicinity of the boundary of a region 11-1 and a region 11-2) of the imaging element 11 in adjacent lens patterns. This image overlap may lead to deterioration of an image after reconstruction and deterioration of a polarization extinction ratio (desired polarized light component/other polarized light components).

Figure 44:
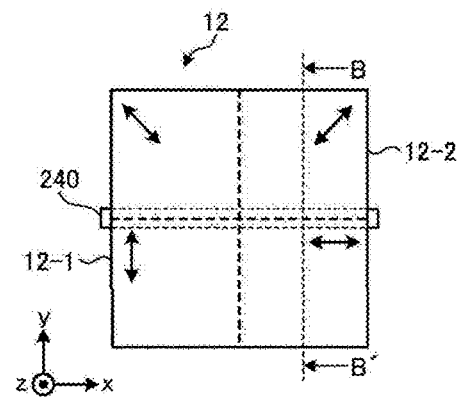
FIG. 44 is a plan view of an imaging element according to modified example 1 of the embodiment.
Figure 45:
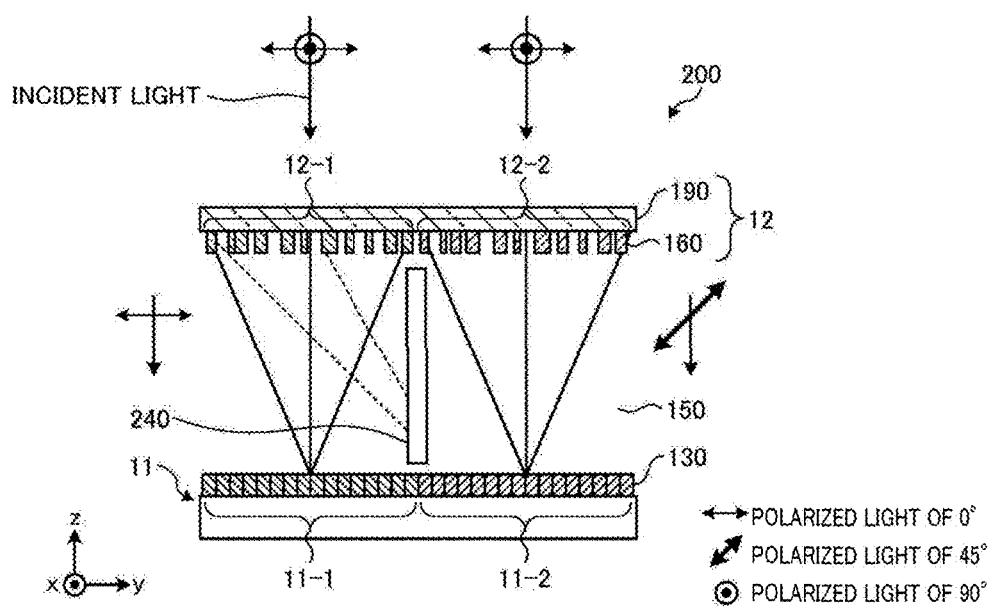
FIG. 45 is a cross-sectional view of the imaging unit along line B-B' of FIG. 44.

FIG. 44 is a plan view of an imaging element according to modified example 1 of the embodiment. The transparent substrate 190 is omitted. FIG. 45 is a cross-sectional view of the imaging unit taken along line B-B' of FIG. 44.

As shown in FIG. 44 and FIG. 45, the imaging unit 200 has a structure in which a barrier 240 is provided immediately below the boundary between a first lens pattern region 12-1 and a second lens pattern region 12-2 (polarization separation region) of the optical element 12 in order to avoid overlap of images.

The barrier 240 is preferably made of a material which absorbs light and does not generate stray light, or is subjected to surface processing for adding similar function.

The barrier 240 is provided between the optical element 12 which is a polarization separation/wavelength dependent PSF lens and the imaging element 11. If the influence between the first lens pattern region 12-1 and the second lens pattern region 12-2 is completely blocked by the barrier 240, overlap of images can be completely removed.

Even a partial barrier has an effect of reducing the influence of overlap of images, and the height and position of the barrier may be determined in accordance with the use, manufacturing, and mounting processes.

[Modified example 2 of embodiment] In the present modified example 2, a modified example in which overlap (crosstalk) of images on pixels of the imaging element 11 can be reduced and the polarization extinction ratio can be improved.

Figure 46:
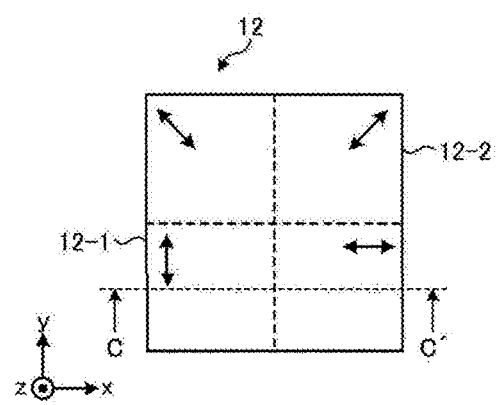
FIG. 46 is a plan view of an imaging unit to which the lens shown in FIG. 1 is applied.
Figure 47:
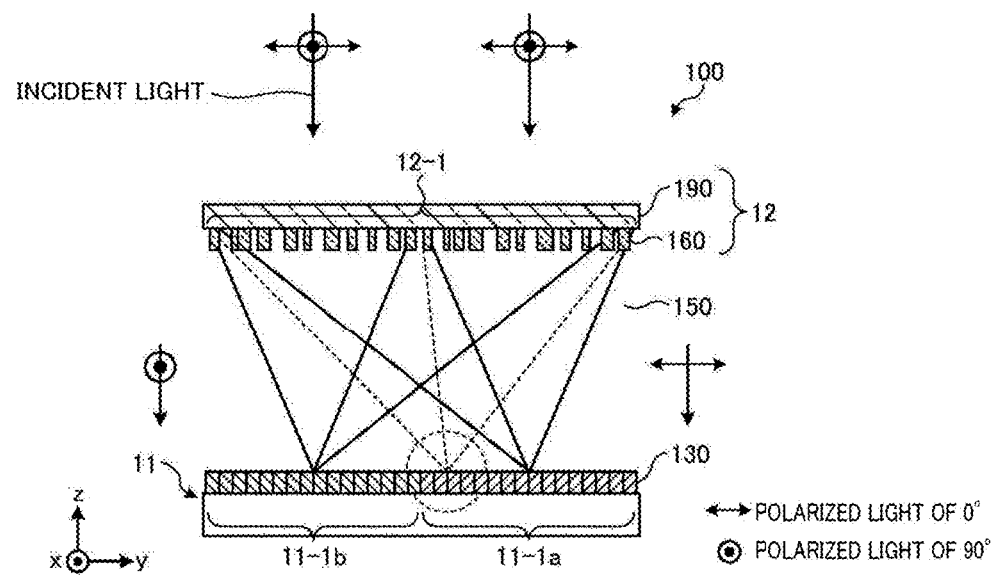
FIG. 47 is a cross-sectional view of the imaging unit along line C-C' of FIG. 46.

In the present modified example 2, a part of the imaging element 11 and the optical element 12 is described as an imaging element. FIG. 46 is a plan view of an imaging unit to which the optical element 12 shown in FIG. 1 is applied. The transparent substrate 190 is omitted. FIG. 47 is a cross-sectional view of the imaging unit taken along line C-C' of FIG. 46.

As shown in FIG. 46 and FIG. 47, there is a concern that overlap (crosstalk) of images occurs in two images formed in a region 11-1a where an image corresponding to a polarized light component of 0° is formed and a region 11-1b where an image corresponding to a polarized light component of 90° is formed after polarization separation in the same lens pattern (for example, the first lens pattern region 12-1) of the imaging element 11. This image overlap may lead to deterioration of an image after reconstruction and deterioration of the polarization extinction ratio (desired polarized light component/other polarized light components).

Figure 48:
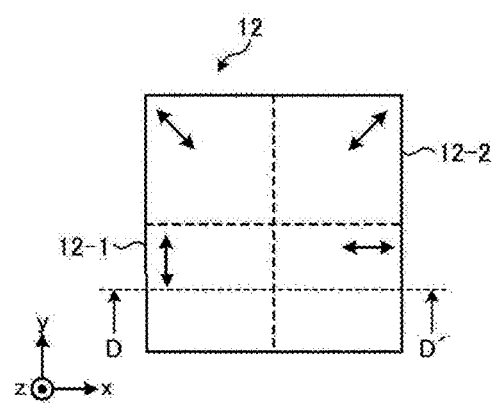
FIG. 48 is a plan view of an imaging element according to modified example 2 of the embodiment.
Figure 49:
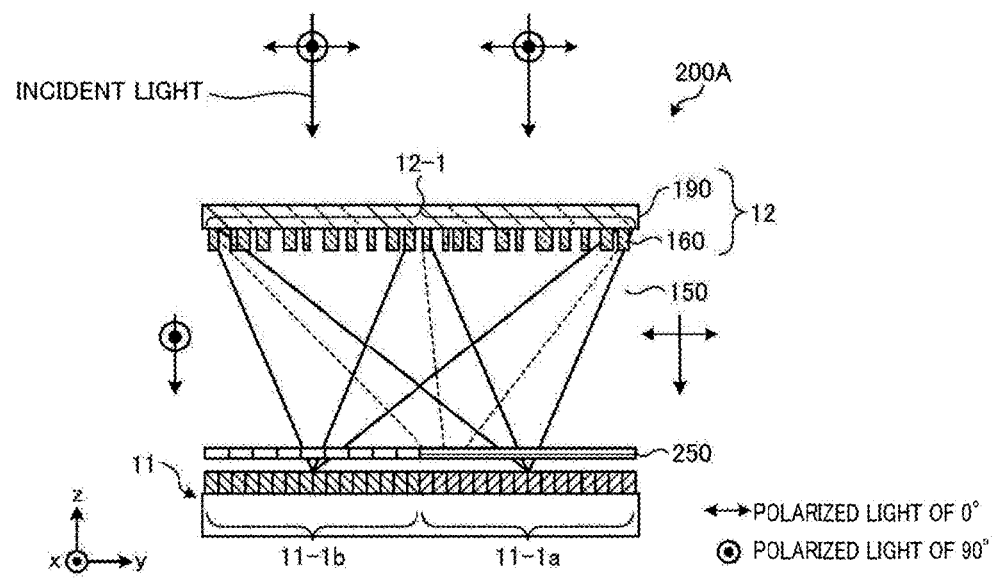
FIG. 49 is a cross-sectional view of the imaging unit taken along line B-B' of FIG. 48.

FIG. 48 is a plan view of an imaging element according to modified example 2 of the embodiment. The transparent substrate 190 is omitted. FIG. 49 is a cross-sectional view of the imaging unit taken along line B-B' of FIG. 48.

As shown in FIG. 48 and FIG. 49, in the imaging unit 200A, a plurality of polarizing filters 250 are provided between the optical element 12 and the imaging element 11 in order to avoid overlap of images and correspond to imaging positions of light spatially polarized and separated by the optical element 12.

Therefore, light composed of each polarized light component separated by the lens is surely transmitted through the corresponding polarizing filter. Thereafter, light is imaged on the imaging element 11. In this case, a polarization direction of separated light is caused to coincide with a polarization transmission axis of the corresponding polarizing filter 250.

In this manner, in the imaging unit 200A, polarizing filters making polarization transmission axes coincide with a polarization direction corresponding to pixels positioned immediately therebelow are provided between the optical element 12 and the imaging element 11. Accordingly, in the imaging unit 200A, light can be guided onto pixels 130 of the imaging element 11 in a state in which components other than a desired polarized light component are cut, and thus overlap of images in the vicinity of the boundary of images composed of different polarized light components can be completely removed. Therefore, it is possible to greatly reduce crosstalk of images according to the imaging unit 200A.

Further, in the imaging unit 200A, double polarizing filtering by the optical element 12 and the polarizing filters 250 is performed. Since this leads to improvement in the polarization extinction ratio, the imaging unit 200A can also realize improvement in the quality of a polarized image.

The imaging unit 200A using the polarizing filters 250 can add the aforementioned effects while maintaining high light utilization efficiency. This is because polarization filtering is performed after polarization separation and thus the total amount of light reaching the pixel array is hardly reduced.

The imaging unit 200A may further include the barrier 240 shown in FIG. 44 and FIG. 45. By using the polarizing filter 250 and the barrier 240 in combination, crosstalk of polarized images is almost eliminated, and a polarized spectral image having higher image quality can be generated.

[Lens structure examples] The optical element 12 is not limited to the configuration shown in FIG. 3 and FIG. 4 and may have various forms in the number, interval, structure shape, and layout pattern of the structures 160. Further, the structures 160 may be connected or may be embedded in a transparent material.

In FIG. 3 and FIG. 4, the optical element 12 is formed on the bottom surface of the transparent substrate 190, but the present invention is not limited thereto. FIG. 50 to FIG. 55 are diagrams schematically showing other examples of a part of the cross section of the optical element 12 according to the embodiment.

Figure 50:
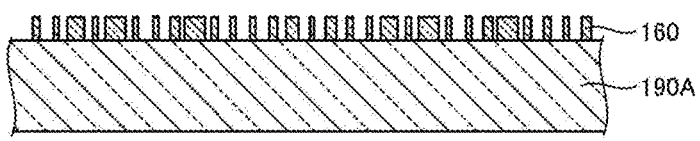
FIG. 50 is a diagram schematically showing another example of a part of the cross section of an optical element 12 according to an embodiment.

As shown in FIG. 50, the structures 160 of the optical element 12 may be formed on the upper surface of a transparent substrate 190A. In this case, the structures 160 are supported by the transparent substrate 190A. A transparent layer above the structures 160 may air or a protective layer such as a resin, and the material of the transparent layer may be a single material or a plurality of layered materials.

Figure 51:
FIG. 51 is a diagram schematically showing another example of a part of the cross section of the optical element 12 according to the embodiment.

As shown in FIG. 51, the structures 160 of the optical element 12 may be embedded in a transparent substrate 190B. The material of the transparent substrate 190B may be a single material or a plurality of layered materials.

Figure 52:
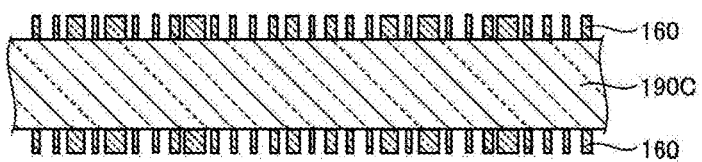
FIG. 52 is a diagram schematically showing another example of a part of the cross section of the optical element 12 according to the embodiment.

As shown in FIG. 52, the structures 160 of the optical element 12 may be formed on both sides of a transparent substrate 190C. The polarization separation/wavelength dependent PSF function described above may be realized by structures 160 on both sides of the transparent substrate 190C. Further, the wavelength dependent PSF function may be realized by the structures 160 of the transparent substrate 190C, and other optical functions such as a filter, a splitter, and a light shielding layer may be realized on the other side. The transparent layer above the structures 160 may be air or a protective layer such as a resin, and the material of the transparent layer may be a single material or a plurality of layered materials.

Figure 53:
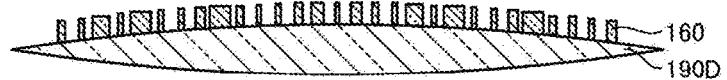
FIG. 53 is a diagram schematically showing another example of a part of the cross section of the optical element 12 according to the embodiment.

As shown in FIG. 53, the structures 160 of the optical element 12 may be formed on a refractive lens 190D. The structures 160 are supported on the refractive lens 190D. The refractive lens 190D is useful in improving the condensing performance of wavelength-dependent condensing characteristics (achieving a high NA, and the like). This also applies to refractive lenses 190E and 190F which will be described below. The transparent layer above the structures 160 may be air or a protective layer such as a resin. The material of the refractive lens 190D may be a single material or a plurality of layered materials.

Figure 54:
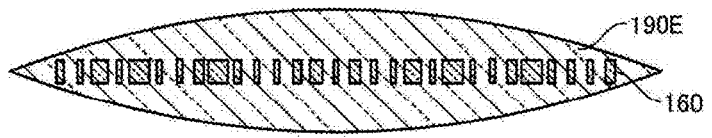
FIG. 54 is a diagram schematically showing another example of a part of the cross section of the optical element 12 according to the embodiment.

As shown in FIG. 54, the structures 160 of the optical element 12 may be embedded in the refractive lens 190E. The material of the refractive lens 190E may be a single material or a plurality of layered materials.

Figure 55:
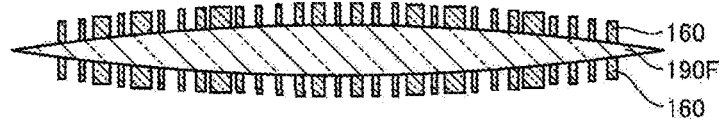
FIG. 55 is a diagram schematically showing another example of a part of the cross section of the optical element 12 according to the embodiment.

As shown in FIG. 55, the structures 160 of the optical element 12 may be formed on both sides of the refractive lens 190F. The above-mentioned wavelength dependent PSF function may be realized by the structures 160 on both sides of the refractive lens 190F. Further, the wavelength dependent PSF function may be realized by the structures 160 of the refractive lens 190F, and other optical functions such as a filter, a splitter, and a light shielding layer may be realized on the other side. The transparent layer above the structures 160 may be air or a protective layer such as a resin. The material of the refractive lens 190F may be a single material or a plurality of layered materials.

Although not shown in FIG. 50 and FIG. 55, a light shielding film pattern or the like may be formed on the same plane or on the back surface.

In the embodiment, $TiO_2$ and SiN are exemplified as the material of the structures 160. However, the material of the structures 160 is not limited thereto. For example, for light having a wavelength of 380 nm to 1,000 nm (visible light to near-infrared light), SiC, $TiO_2$, GaN, and the like may be used as the material of the structures 6 in addition to SiN. These materials are suitable because they have high refractive indexes and low absorption loss. When used for light having a wavelength of 800 to 1,000 nm (near infrared light), Si, SiC, SiN, $TiO_2$, GaAs, GaN, and the like may be used as the material of the structures 6. These materials are suitable because of their low loss. For light in a near-infrared region in a long wavelength band (communication wavelength of 1.3 μm, 1.55 μm, or the like), InP and the like can be used as the material of the structures 160 in addition to the above-mentioned materials.

When the structures 160 are formed by pasting, coating, and the like, polyimide such as fluorinated polyimide, benzocyclobutene (BCB), photocurable resin, UV epoxy resin, acrylic resin such as PMMA, polymer such as resist in general, and the like are mentioned as materials.

Further, although an example in which $SiO_2$ and an air layer are assumed as the materials of the transparent layer 150 is shown in the embodiment, the present invention is not limited thereto. Any material having a refractive index lower than that of the material of the structures 160, including a general glass material, and having a low loss with respect to the wavelength of the incident light may be used. Since the transparent layer 150 may have sufficiently low loss for the wavelength of light to reach corresponding pixels, it may be made of the same material as that of the color filter and may be made of an organic material such as a resin, for example. In this case, the transparent layer 150 is not only made of the same material as that of the color filter but also may have the same structure as that of the color filter, and may be designed to have absorption characteristic corresponding to the wavelength of light to be guided to corresponding pixels.

Further, although the three primary colors R, G and B are exemplified the colors corresponding to the pixels in the embodiment, the pixels may correspond near infrared light and light having wavelengths other than the three primary colors (for example, infrared light, ultraviolet light, and the like).

Further, an example in which structures having a rectangular shape, a rhombus shape, a cross shape, and an elliptical shape are used as the shape of the structures 160 has been described in the embodiment. These shapes are examples, and only one kind of structure (for example, a rectangular shape) may be used, or two or more kinds of structures (for example, only a rectangular shape and a cross shape) may be used.

The present invention was described based on the specific embodiments. It is obvious that the present invention is not limited to the foregoing embodiments and can be changed in various ways within the scope of the invention.

REFERENCE SIGNS LIST

1 Imaging target
10 Imaging device
11 Imaging element
12 Optical element
13 Signal processing unit
130 Pixel
150 Transparent layer
160 Structure
190, 190A, 190C Transparent substrate
190D to 190F Refractive lens

The invention claimed is:

1. An imaging device comprising:
   an optical element including a transparent substrate, and a plurality of structures disposed on or in the transparent substrate in a plane direction of the transparent substrate;
   an imaging element in which a plurality of pixels including photoelectric conversion elements are disposed; and
   a signal processing unit, including one or more processors, configured to generate an image signal based on an electrical signal acquired from the imaging element, wherein
   the optical element is configured to: (i) polarize incident light into multiple polarized light components, each polarized light component having a different polarization direction, and (ii) cause dispersion that separates each polarized component into different wavelengths, wherein the optical element is further configured to form an image in which a point spread function of each of the different wavelengths is convoluted on the plurality of pixels corresponding to each polarized light component among the multiple polarized light components by outputting light in a state in which the optical element has different point spread functions for respective wavelengths,
      the plurality of structures have the same height in a side view, and
      the signal processing unit reconstructs an image in which a point spread function of each wavelength is convoluted for each polarized light component.

2. The imaging device according to claim 1, wherein the signal processing unit reconstructs an image for each polarized light component based on a matrix defined by an imaging process of the optical element and an image in which a point spread function of each wavelength is convoluted.

3. The imaging device according to claim 2, wherein the signal processing unit solves an optimization problem having the matrix defined by the imaging process of the optical element and the image in which the point spread function of each wavelength is convoluted as inputs using a model configured by a neural network.

4. The imaging device according to claim 1, wherein each of the plurality of structures is a columnar structure having a refractive index higher than a refractive index of the transparent substrate and providing an optical phase delay amount corresponding to a cross-sectional shape to the incident light,
   the plurality of structures have a cross-sectional shape which is set according to an optical phase amount delay distribution for forming an image in which a point spread function of each wavelength for the pixels is convoluted on the plurality of pixels corresponding to each polarized light component among the multiple polarized light components, and are arranged according to the optical phase amount delay distribution for forming the image in which the point spread function of each wavelength for the pixels is convoluted on the plurality of pixels corresponding to each polarized light component among the multiple polarized light components.

5. The imaging device according to claim 1, wherein a cross-sectional shape of each of the plurality of structures is a 2-order rotationally symmetrical shape.

6. The imaging device according to claim 1, wherein a barrier for absorbing light is provided immediately below a boundary of polarization separation regions in the optical element.

7. The imaging device according to claim 1, further including a polarizing filter provided between the optical element and the imaging element and making a polarization transmission axis coincident with a polarization direction corresponding to the pixels positioned immediately below the polarizing filter.

8. An optical element comprising a transparent substrate, and a plurality of structures disposed on or in the transparent substrate in a plane direction of the transparent substrate, wherein
  the optical element is configured to: (i) polarize incident light into multiple polarized light components, each polarized light component having a different polarization direction, and ii) cause dispersion that separates each polarized component into different wavelengths, wherein the optical element is further configured to form an image in which a point spread function of each of the different wavelengths is convoluted on a plurality of pixels of an imaging element corresponding to each polarized light component among the multiple polarized light components by outputting light in a state in which the optical element has different point spread functions for respective wavelengths, and
  the plurality of structures have the same height in a side view.

* * * * *